United States Patent
Mori et al.

[11] Patent Number: 5,848,088
[45] Date of Patent: Dec. 8, 1998

[54] SURFACE EMISSION TYPE SEMICONDUCTOR FOR LASER WITH OPTICAL DETECTOR, METHOD OF MANUFACTURING THEREOF, AND SENSOR USING THE SAME

[75] Inventors: Katsumi Mori; Takayuki Kondo; Takeo Kaneko, all of Nagano-ken, Japan

[73] Assignee: Seiko Epson Corporation, Tokyo, Japan

[21] Appl. No.: 979,945

[22] Filed: Nov. 26, 1997

Related U.S. Application Data

[63] Continuation-in-part of Ser. No. 925,635, Sep. 9, 1997, abandoned, which is a continuation of Ser. No. 676,806, Jul. 8, 1996, abandoned.

[30] Foreign Application Priority Data

Jul. 11, 1995 [JP] Japan ................................ 7-198203

[51] Int. Cl.⁶ .............................. H01S 3/19; H01S 3/08; H01L 21/20
[52] U.S. Cl. .................. 372/50; 372/96; 438/24
[58] Field of Search ................. 372/45, 46, 50, 372/96, 99; 438/24, 34, 39

[56] References Cited

U.S. PATENT DOCUMENTS

| | | | |
|---|---|---|---|
| 4,996,163 | 2/1991 | Sasaki | 257/184 |
| 5,132,982 | 7/1992 | Chan et al. | 372/45 |
| 5,293,393 | 3/1994 | Kosaka | 257/85 |
| 5,331,658 | 7/1994 | Shieh et al. | 372/50 |
| 5,404,373 | 4/1995 | Cheng | 372/50 |
| 5,481,386 | 1/1996 | Shimano et al. | 369/44.12 |
| 5,491,712 | 2/1996 | Lin et al. | 372/50 |
| 5,546,496 | 8/1996 | Kimoto et al. | 385/146 |

FOREIGN PATENT DOCUMENTS

| | | |
|---|---|---|
| A2-514283 | 11/1992 | European Pat. Off. . |
| 62-18785 | 1/1987 | Japan . |
| A-62-14465 | 1/1987 | Japan . |
| A-62-188385 | 8/1987 | Japan . |
| 1-120874 | 5/1989 | Japan . |
| A-5-190978 | 7/1993 | Japan . |
| A-6-209138 | 7/1994 | Japan . |
| A-7-192291 | 7/1995 | Japan . |
| A-7-326023 | 12/1995 | Japan . |

OTHER PUBLICATIONS

Bar–Chaim et al., *Monolithic optoelectronic integration of a GaAlAs laser, a field–effect transistor, and a photodiode,* Appl. Phys. Lett. 44(10), May 15, 1984, pp. 941–943.

Woolnough et al., *Fabrication of a Four–Channel DFB Laser Transmitter OEIC For 1550 nm Operation,* Electronic Letters, 29, Jul. 22, 1993, No. 15, Stevenage, Herts., GB, pp. 1388–1390.

Zhou et al., *Inverting and Latching Optical Logic Gates Based on the Integration of Vertical–Cavity Surface–Emitting Lasers and Photothyristors,* IEEE Photonics Technology Letters, 4(1992) Feb., No. 2, New York, US, pp. 157–159.

*Primary Examiner*—Rodney B. Bovernick
*Assistant Examiner*—Quyen Phan Leung
*Attorney, Agent, or Firm*—Oliff & Berridge, PLC

[57] ABSTRACT

A surface emission type semiconductor laser having an optical detector which can satisfactorily assure both the laser emission characteristics of the photoemitter and the optical-to-electrical conversion efficiency. The laser comprises a first conducting semiconductor layer and a second conducting semiconductor layer formed on first and second regions of a semiconductor substrate. Over the second conducting semiconductor layer on the first region is formed an optical resonator which emits light perpendicular to the plane of the semiconductor substrate. On the second region, at least one photodiode is formed by the first and second conducting semiconductor layers. On the first region the second conducting semiconductor layer is formed with a thickness of at least 1 $\mu$m, and is used as a lower electrode for supplying a current to the optical resonator. On the second region, the second conducting semiconductor layer forming the at least one photodiode is formed with a thickness of less than 1 $\mu$m after etching.

29 Claims, 13 Drawing Sheets

5,848,088

SURFACE EMISSION TYPE SEMICONDUCTOR FOR LASER WITH OPTICAL DETECTOR, METHOD OF MANUFACTURING THEREOF, AND SENSOR USING THE SAME

CROSS-REFERENCE TO RELATED APPLICATION

This application is a continuation-in-part of application Ser. No. 08/925,635 filed Sep. 9, 1997 (abandoned) which is a continuation of application Ser. No. 08/676,806 filed Jul. 8, 1996 (abandoned).

BACKGROUND OF THE INVENTION

1. Field of the Invention

The present invention relates to a surface emission type semiconductor laser provided with an optical detector, and a method of manufacturing thereof, and to a sensor using the same.

2. Related Art

As a prior-art device in which an optical detector comprising a photodiode, transistor, or the like, is used in a pair with a photoemitter of a semiconductor laser, an optical pickup is known for example. The optical pickup records and plays back information optically. In such a device, the laser beam from the semiconductor laser is directed at a recording medium, and the reflected beam is detected by the optical detector, thus allowing information to be recorded and played back. In an optical inter connection or optical computer, the semiconductor laser is activated by the light injected into the optical detector, and a laser beam is emitted from the semiconductor laser at an intensity corresponding to the incident light intensity.

In this type of semiconductor laser equipped with an optical detector, it is necessary to precisely set the positional relation between the optical detector and the semiconductor laser.

In this case, if the optical detector and semiconductor laser are formed as separate components, the positional relation between the two depends on the subsequent positioning accuracy, and there are limits to the high positioning accuracy which can be obtained.

On the other hand, it has been proposed, in Japanese Patent Application Laid-Open Nos. 5-190978 and 6-209138, to form the optical detector and photoemitter on the same substrate.

In the inventions disclosed in these publications, the crystal growth layer required for the optical detector and photoemitter is formed by simultaneous crystal growth on a single substrate. As a result, the positional relation between the optical detector and the photoemitter is determined by the patterning accuracy of a photolithography process, and high positional accuracy can be assured.

For the optical detector and photoemitter, however, the optimum conditions required for crystal growth on a single substrate are different, and if the crystal growth layer is formed under process conditions adapted to the characteristics of one of the elements, there is the problem that the characteristics of the other element will be impaired.

In particular, if the crystal growth is carried out under process conditions adapted to the characteristics of the photoemitter element, the sensitivity of the optical detector is impaired, and the optical detector is no longer able to detect low light levels with the appropriate accuracy.

SUMMARY OF THE INVENTION

It is the object of the present invention to provide a surface emission type semiconductor laser provided with an optical detector such that while the photoemitter and optical detector are formed on the same substrate, the laser emission characteristics of the photoemitter and the sensitivity characteristics of the optical detector are both assured to be satisfactory, and also to provide a method of manufacturing thereof, and a sensor using the same.

In the surface emission type semiconductor laser having an optical detector according to the present invention, a first conducting semiconductor layer and a second conducting semiconductor layer are formed on each of first and second regions of a semiconductor substrate respectively. A photoemitter is formed on the first region, and for this purpose an optical resonator which emits light perpendicular to the plane of the semiconductor substrate is formed on the second conducting semiconductor on the first region. On the second region, an optical detector is formed, with the first and second conducting semiconductor layers forming at least one photodiode. The second conducting semiconductor layer on the first region is formed with a thickness of at least 1 $\mu$m, and is used as a lower electrode for supplying a current to the optical resonator. In the second region, the second conducting semiconductor layer forming the at least one photodiode is formed with a thickness of less than 1 $\mu$m.

The reason for making the thickness of the second conducting semiconductor layer different for the photoemitter and the optical detector is as follows. First, since the second conducting semiconductor layer on the photoemitter side functions as a lower electrode, the resistance value added to that of the photoemitter element becomes large, and the heating effect cannot be ignored unless the layer electrical resistance is low. The resistance of the second conducting semiconductor layer depends on the carrier concentration within the layer and the layer thickness. Thus, if the layer thickness is increased the carrier concentration can be reduced. If the lower limit for the thickness of the layer is 1 $\mu$m, an excess carrier concentration exceeding $2 \times 10^{19}$ cm$^{-3}$ is not reached to obtain low value resistance, and thus crystalline deterioration due to high carrier concentration can also be reduced. The second conducting semiconductor layer on the optical detector side is also formed by the same process as is used to form the second conducting semiconductor layer on the photoemitter side, and thus crystalline deterioration also does not occur on the optical detector side, so that there is no impairment of the efficiency of optical-to-electrical conversion. Moreover, since the carrier concentration in the second conducting semiconductor layer is determined by the resistance value of the photoemitter, the thickness of the second conducting semiconductor layer in the optical detector region is made to be less than 1 $\mu$m to keep the light absorption ratio to a low value in the second conducting semiconductor layer on the optical detector side, which has the same carrier concentration as the layer on the photoemitter side.

In the present invention it is preferable that the second conducting semiconductor layer on the first region has a thickness of 5 $\mu$m or less.

The thicker the second conducting semiconductor layer on the photoemitter region is made, the smaller the resistance, but increasing the thickness increases the growth time, and it should be not more than 5 $\mu$m from mass-producibility and crystalline quality point of view.

In the present invention it is preferable that each of the second conducting semiconductor layer on the first and second regions has the carrier concentration from $5 \times 10^{17}$ to $2 \times 10^{19}$ cm$^{-3}$.

When the thickness of the second conducting semiconductor layer on the photoemitter region is at its upper limit of 5 μm, the necessary carrier concentration to lower a resistance value is $5 \times 10^{17}$ cm$^{-3}$, and at its lower limit of 1 μm, the necessary carrier concentration is $2 \times 10^{19}$ cm$^{-3}$. As a result, when the thickness of the second conducting semiconductor layer on the photoemitter region is considered to be in the range 1 μm to 5 μm, the carrier concentration is preferably in the range $5 \times 10^{17}$ to $2 \times 10^{19}$ cm$^{-3}$.

In the present invention it is preferable that the second conducting semiconductor layer on the first region has a thickness from 2 μm to 3 μm. When the low resistance value of the second conducting semiconductor layer on the photoemitter region, and mass-producibility and crystalline quality are all considered, it is preferable for the thickness to be in the above range.

In the present invention it is preferable that the carrier concentration in the second conducting semiconductor layer be from $1 \times 10^{18}$ to $1 \times 10^{19}$ cm$^{-3}$. When the thickness of the second conducting semiconductor layer on the photoemitter region is in its more preferable range of 2 μm to 3 μm, from the viewpoint of ensuring a low resistance value, the carrier concentration should preferably be in the range from $1 \times 10^{18}$ to $1 \times 10^{19}$ cm$^{-3}$.

In the present invention it is preferable that the second conducting semiconductor layer on the second region has a thickness of 0.8 μm or less, and more preferably 0.5 μm or less. This is to assure a high efficiency for the optical-to-electrical conversion.

It should be noted that the second conducting semiconductor layer on the photoemitter region has a thickness of preferably at least 0.1 μm. One reason for this is that if the thickness goes below this lower limit of 0.1 μm, it is difficult for the current to flow, and there is the problem of heat production. Another reason is that in the fabrication process, during etching it is difficult to control the thickness below this lower limit, and even if a thin layer below this limit is used, as described below the optical-to-electrical conversion efficiency is not improved. In view of this, by making the thickness of the second conducting semiconductor layer on the photoemitter region between 0.4 μm and 0.5 μm, in practice an adequate optical-to-electrical conversion efficiency can be obtained, and fabrication problems are avoided.

In the present invention the optical resonator may comprise: a pair of reflecting mirrors, and a multilayer semiconductor layer formed between the pair of reflecting mirrors including at least an active layer and a cladding layer. In this case, an upper layer of the multilayer semiconductor layer including at least the cladding layer forms a pillar portion, and an insulating layer is embedded in the periphery of the pillar portion. Furthermore, an upper electrode is provided having an opening formed therein at the end surface of the pillar portion, and one of the pair of mirrors being on the light emitting side is formed to cover the opening.

With this construction, the current supplied to the optical resonator and the light generated thereby in the active layer are confined to the pillar portion embedded with the insulating layer, and laser beam generation can be carried out efficiently.

When this construction is adopted, preferably, one of the pair of reflecting mirrors formed on the second conducting semiconductor layer is a semiconductor multilayer mirror, and the mirror on the light emitting side is a dielectric multilayer mirror; and wherein the multilayer semiconductor layer formed between the pair of reflecting mirrors includes:
a first cladding layer formed on the semiconductor multilayer mirror;
an active layer of quantum well structure formed on the first cladding layer;
a second cladding layer formed on the active layer; and
a contact layer formed on the second cladding layer;
and the second cladding layer and the contact layer form the pillar portion.

With this construction, the current supplied to the optical resonator is efficiently converted to light in the quantum well active layer, and the light is reciprocated between the pair of reflecting mirrors constituted by the semiconductor multilayer mirror and the dielectric multilayer mirror and having a relatively high reflectance due to the multilayer construction, whereby the light is amplified efficiently. Moreover, the current supplied to the optical resonator and the light generated and amplified therein are confined to the insulating layer embedded around the pillar portion, and laser beam generation can be carried out efficiently.

In the present invention it is preferable that the first conducting semiconductor layer on the first region and the first conducting semiconductor layer on the second region be electrically insulated, and the second conducting semiconductor layer on the first region and the second conducting semiconductor layer on the second region be electrically insulated.

By doing this, the photoemitter and optical detector are electrically isolated, and it is for example possible for the light emitted by the photoemitter to be reflected, detected by the optical detector, and the intensity of the reflected light measured, for use in a variety of sensors.

The method of the present invention relates to the formation of a surface emission type semiconductor laser formed on a first region of a high-resistance semiconductor substrate, and of at least one photodiode on a second region of the semiconductor substrate, comprising the steps of:

(a) successively epitaxially growing on each of the first and second regions a first conducting semiconductor layer, a second conducting semiconductor layer having a thickness of at least 1 μm, and an optical resonator formed from a pair of reflecting mirrors and a multi-layer semiconductor layer formed therebetween excluding the reflecting mirror on the emission side;

(b) etching upper layers of the multilayer semiconductor layer including at least a cladding layer to form a pillar portion on the first region of the epitaxial growth layers;

(c) embedding an insulating layer in the periphery of the pillar portion;

(d) forming an upper electrode having an opening formed therein at the end surface of the pillar portion;

(e) forming the mirror on the light emitting side to cover the opening; and (f) etching the epitaxial growth layer in the second region, in which the etching step is terminated leaving a part of the second conducting semiconductor layer so that the second conducting semiconductor layer on the second region has a thickness of less than 1 μm.

In the method of the present invention, it is also possible for the reflecting mirror formed in step (a) to be a semiconductor multilayer mirror, and for the multilayer semiconductor layer to comprise a first cladding layer of the second conducting type, an active layer of quantum well structure, a second cladding layer of the first conducting type, and a contact layer of the first conducting type, with these layers formed sequentially by epitaxial growth.

In step (a) of the method of the present invention, it is preferable that the carrier concentration in the second conducting semiconductor layer be from $5 \times 10^{17}$ to $2 \times 10^{19}$ cm$^{-3}$, and the thickness of the second conducting semiconductor layer be 5 µm or less.

In step (a) of the method of the present invention, it is even more preferable that the carrier concentration in the second conducting semiconductor layer be from $1 \times 10^{18}$ to $1 \times 10^{19}$ cm$^{-3}$, and the thickness of the second conducting semiconductor layer be from 2 to 3 µm.

In step (f) of the method of the present invention, the thickness of the second conducting semiconductor layer on the second region may be 0.8 µm or less, and more preferably 0.5 µm or less.

In step (a) of the method of the present invention, during the epitaxial growth of at least the second conducting semiconductor layer and the mirror thereon, light of a predetermined wavelength may be irradiated at the second conducting semiconductor layer and the mirror thereon, to detect the reflected spectrum, and to measure the reflectance profile measured to control the thickness of the second conducting semiconductor layer and the mirror thereon.

By this means, for the photoemitter, not only it is possible to form the second conducting semiconductor layer according to design, so as to obtain a low resistance, but also the layer thickness for the reflecting mirror can be formed according to design to obtain a predetermined refractive index. In addition, for the optical detector the thickness of the second conducting semiconductor layer which will be etched in the later step (f), and the thickness of the mirror thereon can be controlled precisely during growth, making it easy to etch it in step (f) to a predetermined thickness.

In step (f) of the method of the present invention, during the etching of at least the second conducting semiconductor layer and the mirror thereon, light of a predetermined wavelength may be irradiated at the second conducting semiconductor layer and the mirror thereon, to detect the reflected spectrum, and to measure the reflectance profile. In this way, the etching of the second conducting semiconductor layer can be controlled precisely to obtain the required layer thickness. Furthermore, since the etching end point of the mirror layer above can also be measured precisely, the etching start point of the second conducting semiconductor layer to obtain the required layer thickness can also be measured precisely.

The method of the present invention also preferably includes steps of electrically insulating the first conducting semiconductor layer on the first region and that on the second region as well as the second conducting semiconductor layer on the first region and that on the second region.

Using the surface emission type semiconductor laser having an optical detector of the present invention, a sensor can be constructed. In this case, the optical resonator may irradiate a relocatable measurement target object with the laser beam, which is reflected on said measurement target object to impinge on the at least one photodiode, and the position of the measurement target object may thus be detected.

Alternatively, the optical resonator may irradiate with the laser beam an element whose position changes according to an applied pressure, and the laser beam reflected on said measurement target object impinges on the at least one photodiode, and the magnitude of the pressure applied to the element whose position changes may thus be detected.

In the case of either of these sensors, efficient laser emission is achieved by the optical resonator acting as the photoemitter, and the photodiode acting as the optical detector can detect low light intensities, and since moreover the relative positioning of the photoemitter and optical detector can be determined with patterning accuracy in a photolithography process, high-accuracy sensing can be achieved. Since both sensors have very small dimensions, they can be mounted in compact components.

In the sensor of the present invention a plurality of photodiodes may be provided, on each of which the reflected laser beam emitted by the one optical resonator impinges. In this case sensing may be carried out based on the distribution of light amounts detected by each of the plurality of photodiodes, while in the case that only one photodiode is provided sensing may be carried out based only on the comparative intensity of light, thus improving the detection accuracy.

PREFERRED EMBODIMENTS OF THE INVENTION

The present invention is now described in terms of preferred embodiments, with reference to the drawings.

(First Embodiment)
Overall Construction

Figure 1:
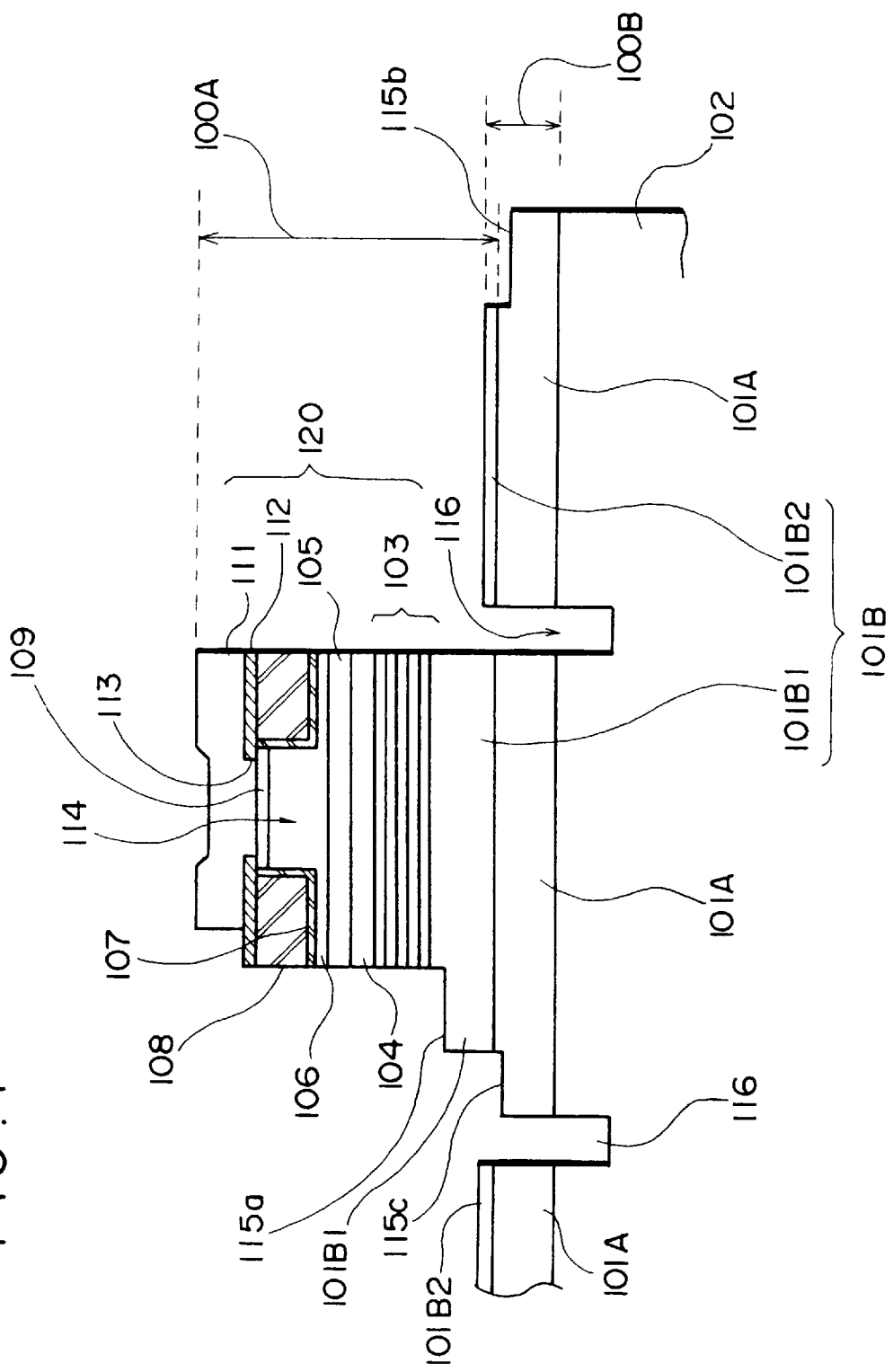
FIG. 1 is a schematic sectional view of the semiconductor laser provided with optical detectors of a first embodiment of the present invention.
Figure 2:
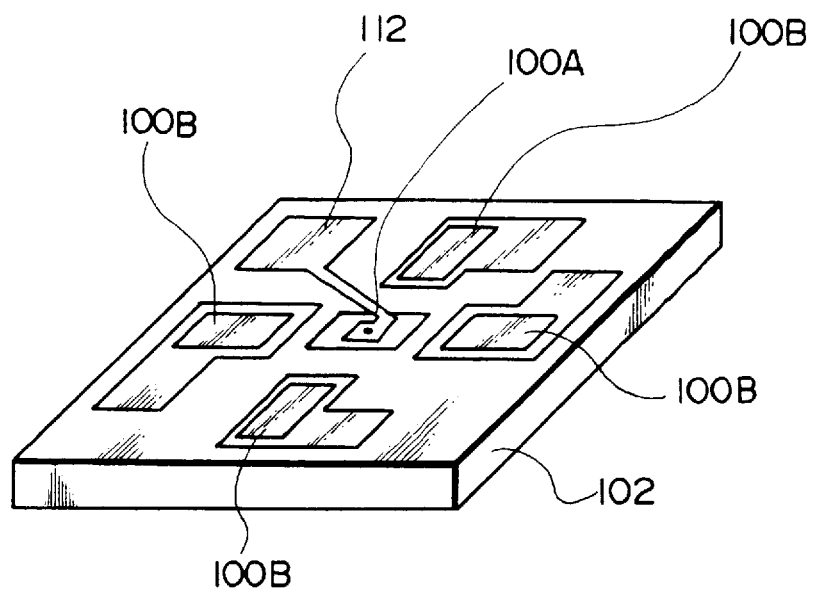
FIG. 2 is a schematic perspective view of the device shown in FIG. 1.

FIG. 1 is a schematic sectional view of the photoemitter and optical detector of a first embodiment of the semiconductor laser provided with an optical detector of the present invention; FIG. 2 is an schematic perspective view of this device.

The semiconductor laser device 100 provided with an optical detector, shown in FIGS. 1 and 2, includes a photoemitter 100A and optical detectors 100B on separate regions of a high-resistance semiconductor substrate 102. In this embodiment, the photoemitter 100A is formed as a surface emission type semiconductor laser, and the optical detectors 100B are formed as photodiodes. The photoemitter 100A and optical detectors 100B are laid out in a planar configuration, and as shown in FIG. 2, the optical detectors 100B are for example provided at four locations around the photoemitter 100A. A single-chip device of such a planar configuration can be used in a variety of sensors. For example, by directing the laser beam from the photoemitter 100A at an object whose position changes, and detecting the reflected beam with the four optical detectors 100B the amount of change in the position of the object can be detected from an analysis of the distribution of light received by each of the optical detectors 100B. In the construction of a sensor from a single-chip device of this type, the numbers of the photoemitter 100A and optical detectors 100B are not limited to those shown in FIG. 2. It is sufficient that for a single photoemitter 100A there is at least one optical detector 100B. Alternatively, for a plurality of photoemitters 100A there may be a plurality of optical detectors 100B.

Common Construction on Substrate

First, the construction of the photoemitter 100A and optical detector 100B is common in that in this embodiment the high-resistance semiconductor substrate 102 is formed as a GaAs substrate, and preferably with an impurity concentration of $1\times10^{16}$ cm$^{-3}$ or less, and more preferably $1\times10^{15}$ cm$^{-3}$ or less.

On the high-resistance GaAs substrate 102 is formed a first conducting semiconductor layer 101A of, for example, p-type GaAs, and further thereon is formed a second conducting semiconductor layer 101B of, for example, n-type GaAs$_{0.85}$Al$_{0.15}$As (the layer on the side of the photoemitter 100A being referred to as 101B1, and the layer on the side of the optical detector 100B being referred to as 101B2). These first and second conducting semiconductor layers 101A and 101B may equally be formed of other materials such as a GaAlAs layer with a different Al composition depending on the wavelength of the laser beam. When monitoring the reflectance of these first and second conducting semiconductor layers 101A and 101B as described below during layer formation or etching in order to control the layer thickness, it is preferable that the first and second conducting semiconductor layers 101A and 101B are of different materials or compositions in order to monitor clearly an increase or decrease in the reflectance. If the second conducting semiconductor layer 101B is of the same material as the first conducting semiconductor layer 101A, formation from n-type GaAs is possible. In this case, since the polarity and concentration of the carriers are different in the two layers, the reflectance can be made different for monitoring. It is not, however, likely that the difference in reflectance can be made as distinct as by changing the material or composition. This is discussed below with respect to FIG. 9.

The first and second conducting semiconductor layers 101A and 101B2 formed in the regions of the optical detectors 100B form photodiodes.

On the other hand, the second conducting semiconductor layer 101B1 formed in the region of the photoemitter 100A functions as a lower electrode layer for supplying a current to a resonator of the surface emission type semiconductor laser. Together with this second conducting semiconductor layer 101B1, the first conducting semiconductor layer 101A can also function as an electrode for the laser resonator, and this point is also discussed below.

Furthermore, the first and second conducting semiconductor layers 101A and 101B1 formed in the region of the photoemitter 100A can also be used as a photodiode for detecting light leaking from the photoemitter 100A, and monitoring the intensity of laser beam emission.

In order to impart the above functions, the first and second conducting semiconductor layers 101A and 101B1 in the region of the photoemitter 100A are exposed, and these exposed surfaces 115a and 115c each form electrode pattern forming surfaces. Similarly, the first conducting semiconductor layer 101A in the regions of the optical detectors 100B is exposed, and this exposed surface 115b forms an electrode pattern forming surface.

The second conducting semiconductor layers 101B1 and 101B2 are formed respectively in the regions of the photoemitter 100A and optical detectors 100B in the same layer formation process. Therefore, the two layers are epitaxially grown on the substrate 102 with the same carrier concentration. However, after layer formation, the second conducting semiconductor layer 101B2 on the side of the optical detector 100B is etched, and thus becomes thinner than the second conducting semiconductor layer 101B1 on the side of the photoemitter 100A.

Also, in this embodiment, the first and second conducting semiconductor layers 101A and 101B1 formed in the region of the photoemitter 100A are electrically insulated from the first and second conducting semiconductor layers 101A and 101B2 formed in the regions of the optical detectors 100B by separating grooves 116. However, when the semiconductor laser with optical detectors has the photoemitter 100A driven based on the current output from the optical detectors 100B, as for example in an element used for an optical interconnection, then there is no necessity for the insulation of the layers 101A and 101B1 from the layers 101A and 101B2 by for example the separating grooves 116.

Construction of Photoemitter

Next, the photoemitter 100A is described. On the second conducting semiconductor layer 101B1, layers of n-type Al$_{0.8}$Ga$_{0.2}$As and n-type Al$_{0.15}$Ga$_{0.85}$As are formed in alternation, and a 40-pair distributed-Bragg reflection type multilayer mirror (henceforth referred to as "DBR mirror") 103 with a reflectance of at least 99.5% with respect to light of a wavelength of about 800 nm, for example, a first cladding layer 104 formed of n-type Al$_{0.7}$Ga$_{0.3}$As, a quantum well active layer 105 (in this embodiment being an active layer of multiple quantum well (MQW) construction) formed from n$^-$-type GaAs well layers and n$^-$-type Al$_{0.3}$Ga$_{0.7}$As barrier layers in which the well layers are in 21 layers, a second cladding layer 106 formed from p-type Al$_{0.7}$Ga$_{0.3}$As, and a contact layer 109 formed from p$^+$-type Al$_{0.15}$Ga$_{0.85}$As, are formed in sequence.

Next, etching is carried out to a level intermediate in the second cladding layer 106, to form a pillar 114 of circular or rectangular shape as seen from above the stacked layers of the semiconductor. By making the lateral cross-section of the pillar 114 parallel to the substrate 102 of rectangular shape having long sides and short sides, the polarization direction of the laser beam emitted from the resonator region of the pillar 114 can be aligned with the orientation of the short sides.

The periphery of the pillar 114 is embedded with a first insulating layer 107 formed of a layer of silicon oxides (SiO$_x$ layer) such as SiO$_2$ by the thermal CVD method, and a second insulating layer 108 formed of a heat-resistant resin or the like such as polyimide.

The first insulating layer 107 is formed continuously in alignment with the surface of the second cladding layer 106 and contact layer 109, and the second insulating layer 108 is formed to fill in around the first insulating layer 107.

As to the second insulating layer 108, in place of the heat-resistant resin such as polyimide, a layer of silicon oxides (SiO$_x$ layer) such as SiO$_2$, a layer of silicon nitrides (SiN$_x$ layer) such as Si$_3$N$_4$, a layer of silicon carbides (SiC$_x$ layer) such as SiC, an insulating silicon compound layer such as an SOG layer (SiO$_x$ such as SiO$_2$ formed by the Spin-On Glass method), or a polycrystalline group II–VI compound semiconductor layer (for example ZnSe) may equally be used. Of these insulating layers, it is preferable to use a silicon oxide film of SiO$_2$ or the like or a polyimide or SOG layer, which can be formed at low temperature. It is further preferable to use an SOG layer, because it is simple to form and to make the surface flat.

The first insulating layer 107 in FIG. 1 formed of a silicon oxide layer (SiO$_x$ layer) has a thickness of 500 to 2000 angstroms, formed by thermal CVD at normal pressure. The second insulating layer 108 formed of a heat-resistant resin or the like is necessary to make the surface of the element flat. If for example the heat-resistant resin is of high electrical resistance, and residual moisture can easily be present in the layer, and when the layer is put in direct contact with the semiconductor layer and the element is energized for a sustained interval, voids tend to occur at the interface between the layer and the semiconductor, deteriorating the characteristics of the element. In this case, as in the present embodiment, inserting a thin layer such as the first insulating layer 107 at the interface between the second insulating layer 108 and the semiconductor layer allows the first insulating layer 107 to act as a protective layer, preventing the aforesaid deterioration. As to the method of forming the silicon oxide layer (SiO$_x$ layer) of the first insulating layer, the plasma CVD method, or reactive vapor deposition may be used. Nevertheless, the ideal method of forming the layer is to use the normal pressure thermal CVD method using SiH$_4$ (monosilane) and O$_2$ (oxygen) gas, with N$_2$ (nitrogen) gas as the carrier. The reasons for this are as following: first, since the layer is formed with the reaction at atmospheric pressure and with an excess of oxygen, a fine layer of SiO$_x$ with few oxygen deficiencies can be formed. Secondly, the step coverage is good, and the same layer thickness is obtained on the side surfaces of the pillar 114 and the step portion as on the flat portion.

The first and second insulating layers 107 and 108 are not restricted to the form of embedded layers, and may for example be formed as a group II–VI compound semiconductor epitaxial layer.

Also, a contact metal layer 112 (upper electrode) formed of for example Cr and Au—Zn alloy is formed in ring-shaped contact with the contact layer 109, and forms an electrode for supplying current. The portion of the contact layer 109 not covered by the contact metal layer 112 is exposed in a circular shape. In order to cover this exposed surface of the contact layer 109 (henceforth referred to as an opening 113) with an adequate area, first layers such as SiO$_x$ layers of for example SiO$_2$ and second layers being for example Ta$_2$O$_5$ layers are alternately formed so as to form a 7-pair dielectric multilayer mirror 111 having a reflectance of between 98.5% and 99.5% with respect to light of a wavelength of about 800 nm.

The pair of mirrors 103 and 111 form, together with the interposed multilayer semiconductor, an optical resonator 120. If the wavelength of the laser beam for which the optical resonator 120 is acting as a waveguide is λ, and the refractive index of the layers with respect to the wavelength λ is n, then the thicknesses of the first and second layers forming the dielectric multilayer mirror 111 is made to be λ/4n.

Laser Emission Operation by Resonator

A forward voltage is applied between the upper electrode 112 and lower electrode layer 101B1 which contacts an electrode not shown in the drawing formed on the electrode pattern forming surface 115a shown in FIG. 1 (in this embodiment, the voltage is applied in the direction from the upper electrode 112 to the second conducting semiconductor layer 101B1 which is the lower electrode), to supply a current. The supplied current is converted into light in the quantum well active layer 105, and this light is amplified reciprocating between the pair of reflecting mirror constituted by the DBR mirror 103 and the dielectric multilayer mirror 111. Moreover, the current supplied to the optical resonator 120 and the created and amplified light are retained by the first and second insulating layers 107 and 108 with which the periphery of the pillar 114 is embedded, to provide efficient laser beam generation.

Through the opening 113 (the exposed portion of the contact layer 109) and the dielectric multilayer mirror 111, laser beam is radiated perpendicularly to the substrate 102.

As another drive method, it is possible to construct a transistor from a p-type semiconductor layer 101A, an n-type semiconductor layer 101B1, and a p-type portion of the optical resonator 120, and to excite an active layer. For example, when a laser stimulation voltage is applied between the p-type semiconductor layer 101A and the upper electrode 112, supplying a very small current to the n-type semiconductor layer 101B1 will, by the transistor switching effect, inject a current into the active layer, and laser emission will be enabled. With a drive method such as this, the laser can be controlled by switching on and off the very small current, making it possible to carry out laser emission from a plurality of photoemitters 100A on a single substrate 102 at high speed.

The second conducting semiconductor layer 101B1 functioning as the lower electrode layer of the surface emission type semiconductor laser requires a lateral resistance of several ohms. The reason for this is that if the element resistance of the photoemitter 100A is from 50 to 100 ohms, and the second conducting semiconductor layer 101B1 has a resistance of some tens of ohms, the heat output from this resistance cannot be ignored.

The resistance value of this second conducting semiconductor layer 101B1 depends on the layer thickness and the carrier concentration, and if the layer is thicker, the carrier concentration can be reduced. From the viewpoint of reducing the resistance, the greater the thickness of the second conducting semiconductor layer 101B1 the better. Nevertheless, this increases the growth time, and creates problems of mass productivity and of the crystalline structure of the layer. In view of the above problems, a preferred upper limit to the thickness of the second conducting semiconductor layer 101B1 is 5 μm, and an even more preferred value is not exceeding 3 μm.

The lower limit to the thickness of the second conducting semiconductor layer 101B1 is determined by the degree to which an excess carrier concentration can be obtained. If the thickness of the second conducting semiconductor layer 101B1 is set at less than 1 μm and to reduce the resistance, an excess carrier concentration exceeding $2\times10^{19}$ cm$^{-3}$ is required, and the risk of crystalline imperfections is increased. Moreover, since crystalline imperfections are created to the same degree in the second conducting semiconductor layer 101B2 in the region of the optical resonator 100B formed in the same process, this leads to a deterioration in the efficiency of optical-to-electrical conversion of the photodiode. As a result, the thickness of the second conducting semiconductor layer 101B1 should be at least 1 μm.

Thus, from the viewpoint of reducing the resistance while cutting the growth time, the thickness of the second conducting semiconductor layer 101B1 on the photoemitter 100A side is preferably between 2 and 3 μm.

It should be noted that for considerations of mass productivity and of crystalline structure, the thickness of the first conducting semiconductor layer 101A is preferably 5 μm or less. Also, the thickness of the first conducting semiconductor layer 101A is preferably at least 1 μm, since problems occur concerning heat generation and difficulty of current flow if it is less than this value.

In consideration of the carrier concentration in the second conducting semiconductor layers 101B1 and 101B2, when the second conducting semiconductor layer 101B1 on the side of the photoemitter 100A is of its maximum thickness of 5 μm, then the carrier concentration necessary to reduce the resistance is $5\times10^{17}$ cm$^{-3}$. On the other hand, when the second conducting semiconductor layer 101B1 is of its minimum thickness of 1 μm, a carrier concentration of $2\times10^{19}$ cm$^{-3}$ is required to reduce the resistance.

As a result, when it is considered that the thickness of the second conducting semiconductor layer 101B1 is to be from 1 μm to 5 μm, it is preferable for the carrier concentration to be in the range from $5\times10^{17}$ cm$^{-3}$ to $2\times10^{19}$ cm$^{-3}$.

Further, when the second conducting semiconductor layer 101B1 is of a thickness of 2 μm being the lower limit of its more preferable range, the carrier concentration necessary to reduce the resistance is $1\times10^{19}$ cm$^{-3}$, and at the upper limit of 3 μm, the carrier concentration is $1\times10^{18}$ cm$^{-3}$. Therefore, when the thickness of the second conducting semiconductor layer 101B1 is in the more preferable range of 2 to 3 μm, it is preferable for the carrier concentration to be in the range from $1\times10^{18}$ cm$^{-3}$ to $1\times10^{19}$ cm$^{-3}$.

Photodetection Operation of Optical Detector

The laser beam emitted from the photoemitter 100A is reflected from the target object, and incident on the optical detectors 100B. Each of the optical detectors 100B is a photodiode constructed from the first and second conducting semiconductor layers 101A and 101B2, and in the depletion layer formed at the interface between these layers 101A and 101B2, light is converted to electrical energy. Then, using an electrode not shown in the drawing formed on the second conducting semiconductor layer 101B2 of the optical detector 100B and an electrode not shown in the drawing formed on the electrode pattern forming surface 115b, the light amount is output as an electrical signal.

The second conducting semiconductor layer 101B2 of the optical detectors 100B is formed in the same process as the same layer 101B1 of the photoemitter 100A, and the carrier concentration in this layer 101B1 is relatively high, with a value as described above.

In this embodiment, by reducing the thickness of the second conducting semiconductor layer 101B2 of the optical detectors 100B, the optical absorption is reduced, and the optical-to-electrical conversion efficiency increased. In this embodiment, the thickness of the second conducting semiconductor layer 101B2 of the optical detectors 100B is made to be less than 1 μm.

Figure 6:
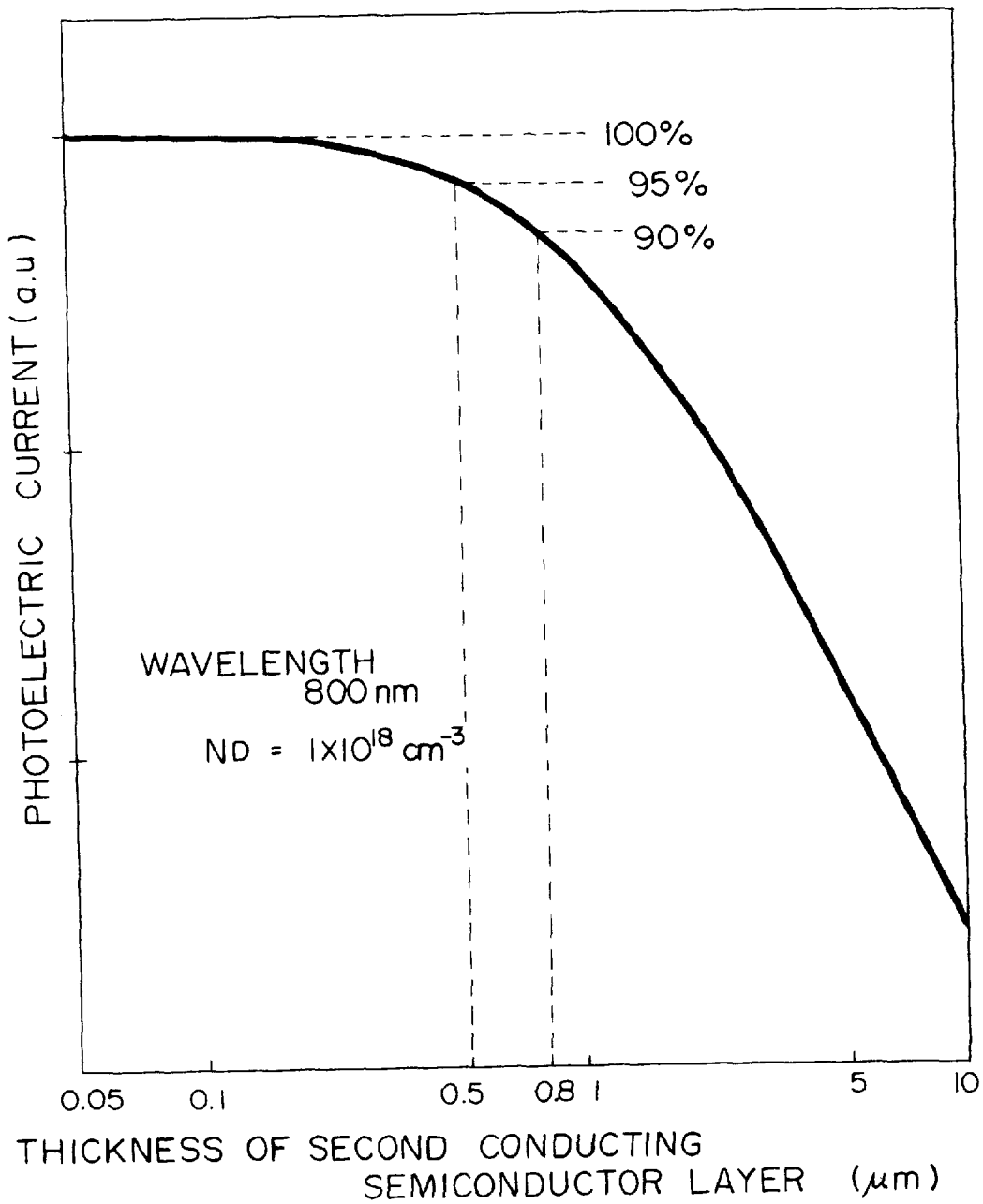
FIG. 6 is a characteristic graph showing the relationship between the thickness of a second conducting layer in the photoemitter of the device shown in FIG. 1 and the photoelectric current.

FIG. 6 shows the simulation results of the relationship between the thickness of the second conducting semiconductor layer 101B2 and the photoelectric current, in the case that the laser emission wavelength is 800 nm, and the level of impurities in the second conducting semiconductor layer 101B2 is $1\times10^{18}$ cm$^{-3}$. As is clear from FIG. 6, the thinner is the second conducting semiconductor layer 101B2, the higher is the conversion efficiency of the photoelectric current, and particularly at 0.8 μm and below, an optical-to-electrical conversion efficiency of 90% can be obtained, and at 0.5 μm, a value of 95%. From this point of view, it is preferable that the thickness of the second conducting semiconductor layer 101B2 is 0.8 μm or less, and more preferable that it is 0.5 μm or less. It should be noted that the layer thickness should be 0.1 μm or more. Otherwise, it is difficult for the current to flow, and there is the problem of heat production. Moreover, as will be seen from FIG. 6, a photoelectric current of 100% can flow in a layer of thickness equal to 0.1 μm or more, and no improvement in optical-to-electrical conversion efficiency can be obtained by reducing the thickness below 0.1 μm.

Fabrication Process

Next, the fabrication process of the surface emission type semiconductor laser 100 shown in FIG. 1 is described. FIGS. 3A to 3C, FIGS. 4A to 4C, and FIGS. 5A and 5B show the fabrication stages of a surface emission type semiconductor laser device provided with optical detectors.

On a high-resistance GaAs substrate 102 are formed a p-type GaAs layer 101A and an n-type $Ga_{0.85}Al_{0.15}As$ layer 101B each by epitaxial growth. At this point, the thickness of the n-type $Ga_{0.85}Al_{0.15}As$ layer 101B is made to be at least 1 μm, and preferably at least 5 μm. The carrier concentration in the n-type $Ga_{0.85}Al_{0.15}As$ layer 101B is preferably in the range from $5\times10^{17}$ cm$^{-3}$ to $2\times10^{19}$ cm$^{-3}$, and more preferably in the range from $1\times10^{18}$ cm$^{-3}$ to $1\times10^{19}$ cm$^{-3}$. In this stage, the second conducting semiconductor layer 101B1 of the photoemitter 100A is formed.

Thereafter, layers of n-type $Al_{0.15}Ga_{0.85}As$ and n-type $Al_{0.8}Ga_{0.2}As$ are formed in alternation, forming a 40-pair DBR mirror 103 with a reflectance of at least 99.5% with respect to light of a wavelength of about 800 nm, acting as a lower mirror. Furthermore, after forming an n-type $Al_{0.7}Ga_{0.3}As$ layer (first cladding layer) 104, n$^-$-type GaAs well layers and n$^-$-type $Al_{0.3}Ga_{0.7}As$ barrier layers are formed in alternation to form a quantum well active layer 105 of multiple quantum well (MQW) construction. Thereafter, a p-type $Al_{0.7}Ga_{0.3}As$ layer (second cladding layer) 106, and a p-type $Al_{0.15}Ga_{0.85}As$ layer (contact layer) 109 are formed in sequence (see FIG. 3A).

The above layers 101A, 101B, 103 to 106 and 109 are epitaxially formed by metal-organic vapor phase epitaxy (MOVPE). Here the conditions used are for example a growth temperature of 750° C., growth pressure of 150 Torr, with the metal-organic compounds TMGa (trimethyl gallium) and TMAl (trimethyl aluminum) being used as the group III source materials, $AsH_3$ being used as group V source material, $H_2Se$ as n-type dopant, and DEZn (diethyl zinc) as p-type dopant.

After forming the layers, a $SiO_2$ layer of about 250 angstroms is formed on the epitaxial layer using the CVD method at normal pressure, to form a protective layer I1. This protective layer I1 covers the surface of the stacked semiconductor layers, thus protecting the surface from contamination during the process.

Next, using the reactive ion beam etching (RIBE) method, the pillar 114 and optical detectors 100B covered by a resist pattern R1 are unetched while a cavity 110 is formed around the pillar 114, etching the layers to an intermediate level in the second cladding layer 106. By means of this etching process, the pillar 114 is given a cross-section having the same shape as the outline of the resist pattern R1 thereon (see FIG. 3B).

Also, by using the RIBE method, the lateral surfaces of the pillar 114 are substantially vertical, and there is almost no damage to the epitaxial layer. As conditions for the RIBE method, for example the pressure is 60 mPa, the input microwave power is 150 W, the extraction voltage is 350 V, and the etching gas is a mixture of chlorine and argon.

Thereafter, the resist pattern R1 is removed, and using the CVD method at normal temperature and pressure, a $SiO_2$ layer of about 1000 angstroms (first insulating layer) 107 is formed. The conditions for this stage of the process are for example a substrate temperature of 450° C., using raw materials of $SiH_4$ (monosilane) and oxygen, and using nitrogen as the carrier gas. Further thereon, an SOG (spin-on glass) layer 108L is applied using the spin coating method, and thereafter the device is baked in nitrogen, for example, at 80° C. for 1 minute, then 150° C. for 2 minutes, and then 300° C. for 30 minutes (see FIG. 3C).

Figure 4A:
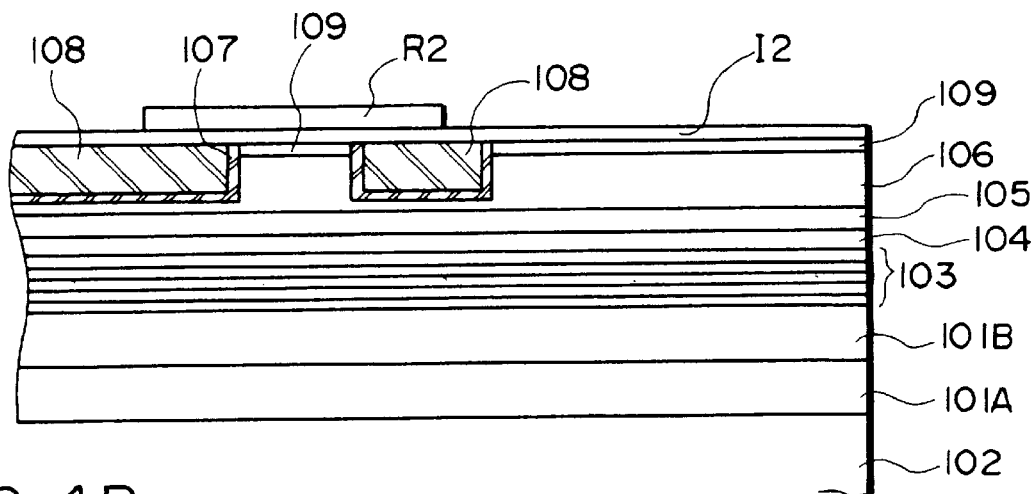
FIGS. 4A to 4C are schematic sectional views illustrating fabrication processes following each of the processes shown in FIGS. 3A to 3C.

The SOG layer 108L and $SiO_2$ layer 107 are etched back, and made so that the surface is flush with the surface of the exposed contact layer 109 (see FIG. 4A). For the etching, reactive ion etching (RIE) method is used with parallel plate electrodes, and a mixture of $SF_6$, $CHF_3$, and Ar is used as the reactive gas Next, leaving the pillar of the photoemitter 100A unetched, the periphery thereof is etched to the interface between the lower mirror 103 and the underlying n-type $Ga_{0.85}Al_{0.15}As$ layer 101B. In other words, the periphery of the photoemitter 100A is etched so as to expose the surface of the n-type $Ga_{0.85}Al_{0.15}As$ layer 101B.

Figure 4B:
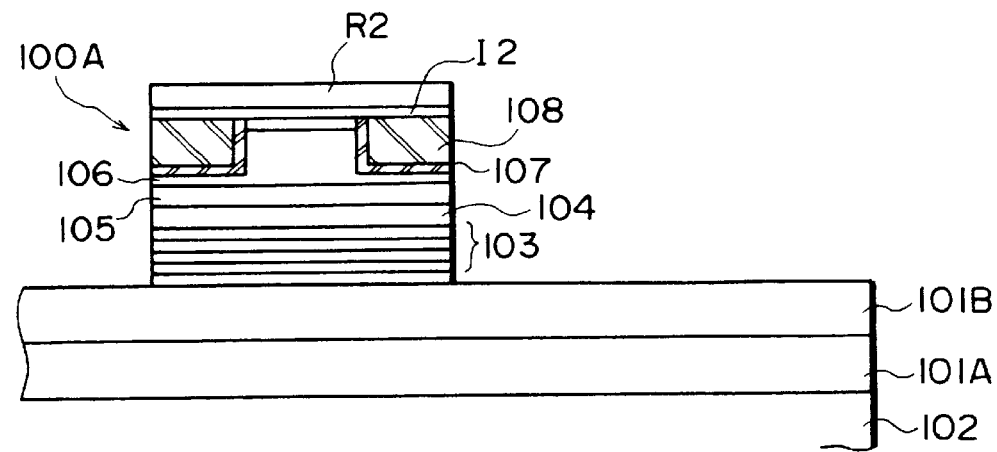

For this etching, a protective layer I2 (for example of $SiO_2$) is formed, and on the region opposite to the photoemitter 100A which is not to be etched, a resist pattern R2 is formed (see FIG. 4B).

Figure 4C:
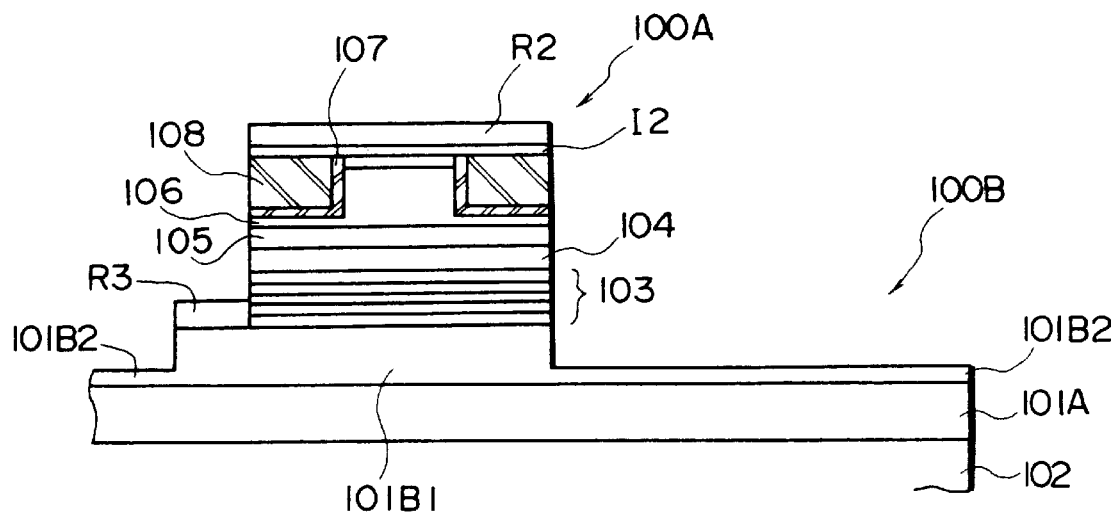

As shown in FIG. 4C, for regions opposite to the optical detectors 100B only, the n-type $Ga_{0.85}Al_{0.15}As$ layer 101B is etched to an optimum thickness for optical detection by the optical detectors 100B. For this purpose, a resist pattern R2 is formed in the region opposite to the photoemitter 100A. Furthermore, a resist pattern R3 is formed covering the region where an electrode pattern forming surface 115a will later be formed. By means of this etching, the n-type $Ga_{0.85}A_{0.15}As$ layer 101B2 being one element forming the photodiode of the photoemitter 100A can be formulated with a thickness of less than 1 $\mu$m, preferably 0.8 $\mu$m or less, and more preferably 0.5 $\mu$m or less, but 0.1 $\mu$m or more.

Figure 5A:
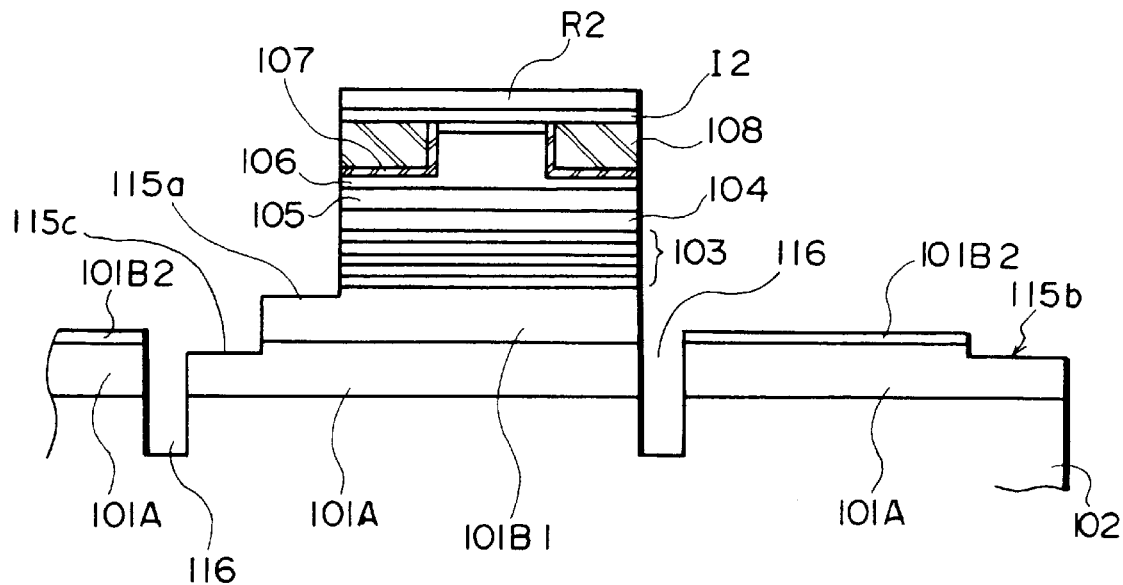
FIGS. 5A and 5B are schematic sectional views illustrating fabrication processes following each of the processes shown in FIGS. 4A to 4C.

Next, as shown in FIG. 5A, etching is used to form stepped surfaces in each of the p-type GaAs layer 101A and n-type $Ga_{0.85}Al_{0.15}As$ layers 101B1 and 101B2, exposing the corresponding layers and forming electrode pattern forming surfaces 115a, 115b, and 115c. The electrode pattern forming surface 115a is formed on the n-type $Ga_{0.85}Al_{0.15}As$ layer 101B1, and on the n-type $Ga_{0.85}Al_{0.15}As$ layer 101B2 which is the lower electrode layer, an electrode pattern is later formed for the purpose of contacting. The electrode pattern forming surface 115b is formed on the p-type GaAs layer 101A of the optical detectors 100B. Further, the electrode pattern surface 115c is formed on the p-type GaAs layer 101A of the photoemitter 100A.

Further, in order to form electrically insulating portion on the regions of the first conducting semiconductor layer 101A of the photoemitter 100A and the optical detector 100B, and on the regions of the second conducting semiconductor layer 101B1 and 101B2 of the photoemitter 100A and the optical detector 100B to insulate respectively from each other, etching is used for example at the interface therebetween to remove the layers 101A and 101B, and form a separating groove 116. For the formation of this separating groove 116, dry etching is preferable, but since there is no effect on light emission or detection of the interface at this separating groove 116, wet etching or forming with a dicing saw is also possible. Also, in place of the insulation provided by the separating groove 116, it is also possible to use for example ion implantation at the interface portion to introduce impurities such as protons or oxygen ions to provide insulation.

Figure 5B:
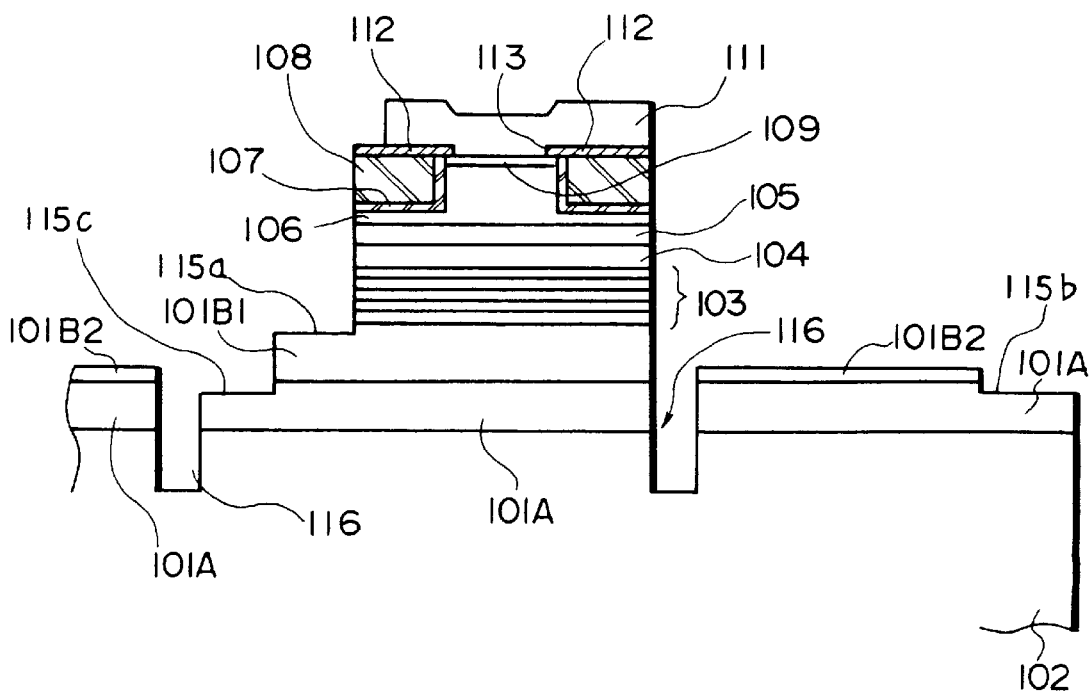

Next, the upper electrode 112 making ring-shaped contact with the contact layer 109 is formed by the well-known lift-off method (see FIG. 5B). The contact layer 109 is exposed through the circular opening 113 in the upper electrode 112, and in order to cover the whole exposed surface, the dielectric multilayer mirror (upper mirror) 111 is formed by the well-known lift-off method or an etching method (see FIG. 5B). The upper mirror 111 is formed using the electron beam vapor deposition method, of alternating $SiO_2$ layers and $Ta_2O_5$ layers making for example seven pairs of layers, thus having a reflectance of between 98.5% and 99.5% with respect to light of a wavelength of about 800 nm. At this time the vapor deposition speed is for example 5 angstroms/minute for the $SiO_2$ and 2 angstroms/minute for the $Ta_2O_5$ layers.

By means of the above process, the surface emission type semiconductor laser with optical detectors shown in FIG. 1 is completed.

Figure 3A:
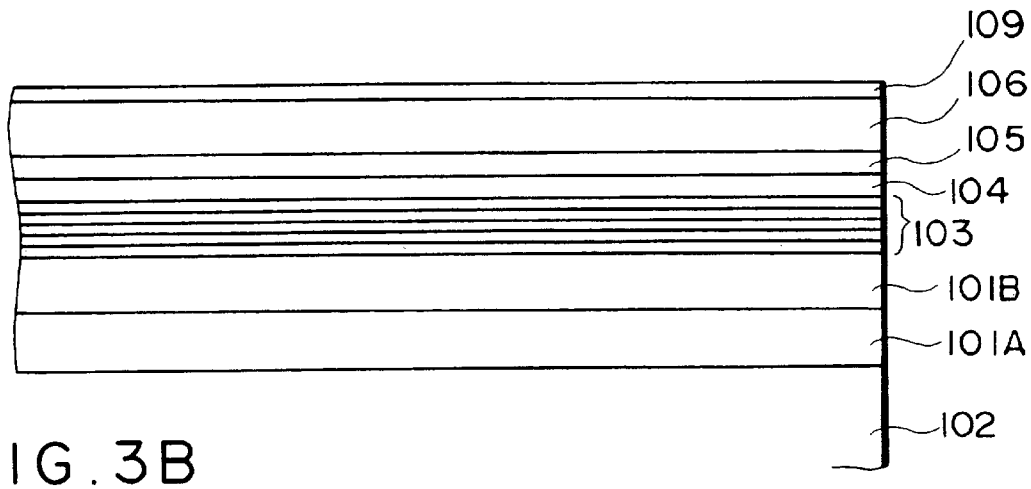
FIGS. 3A to 3C are schematic sectional views illustrating the fabrication process of the device shown in FIG. 1.
Figure 3B:
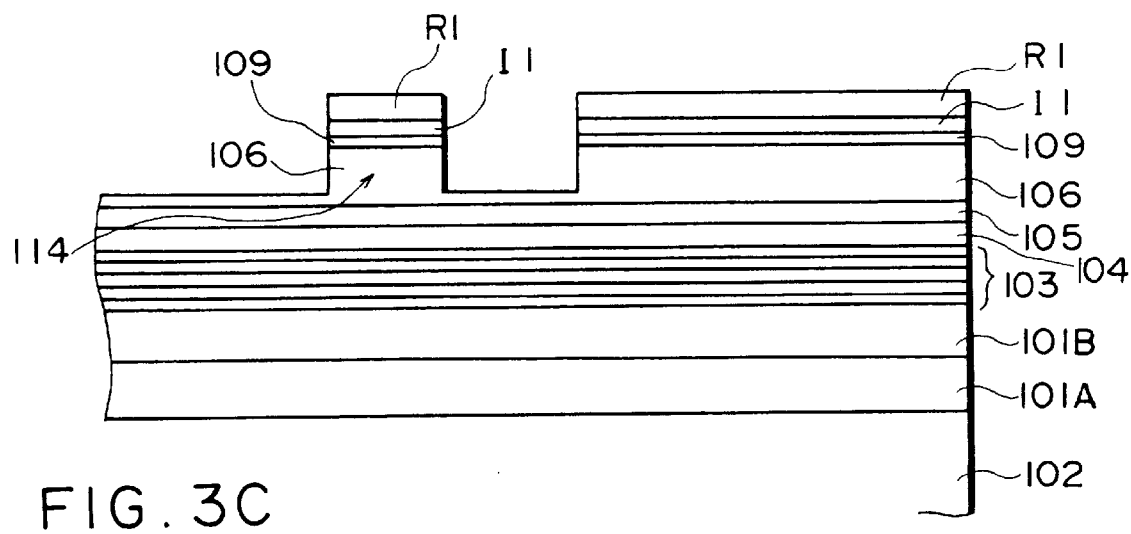
Figure 3C:
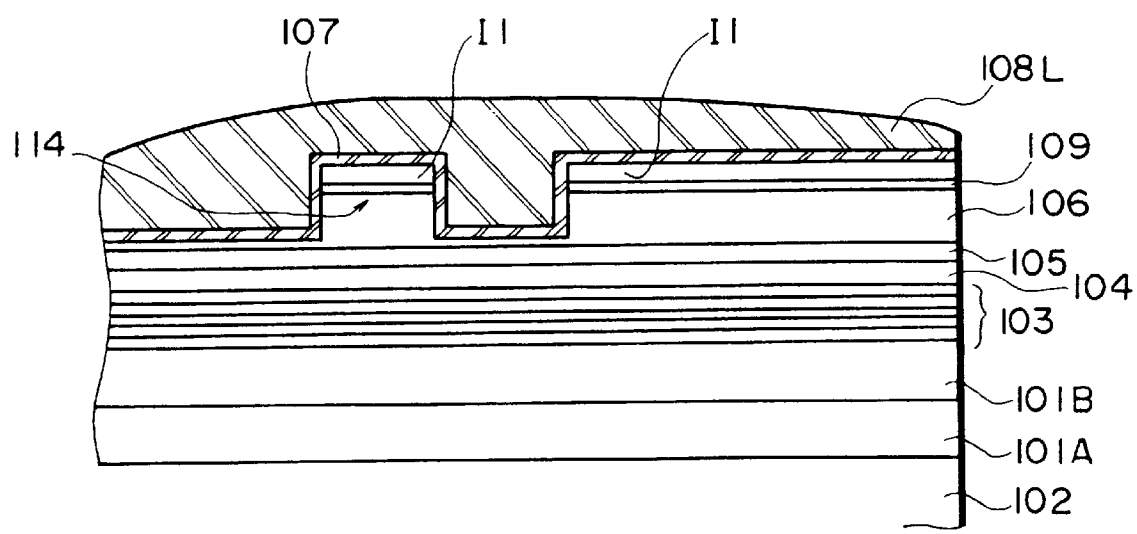
Figure 7:
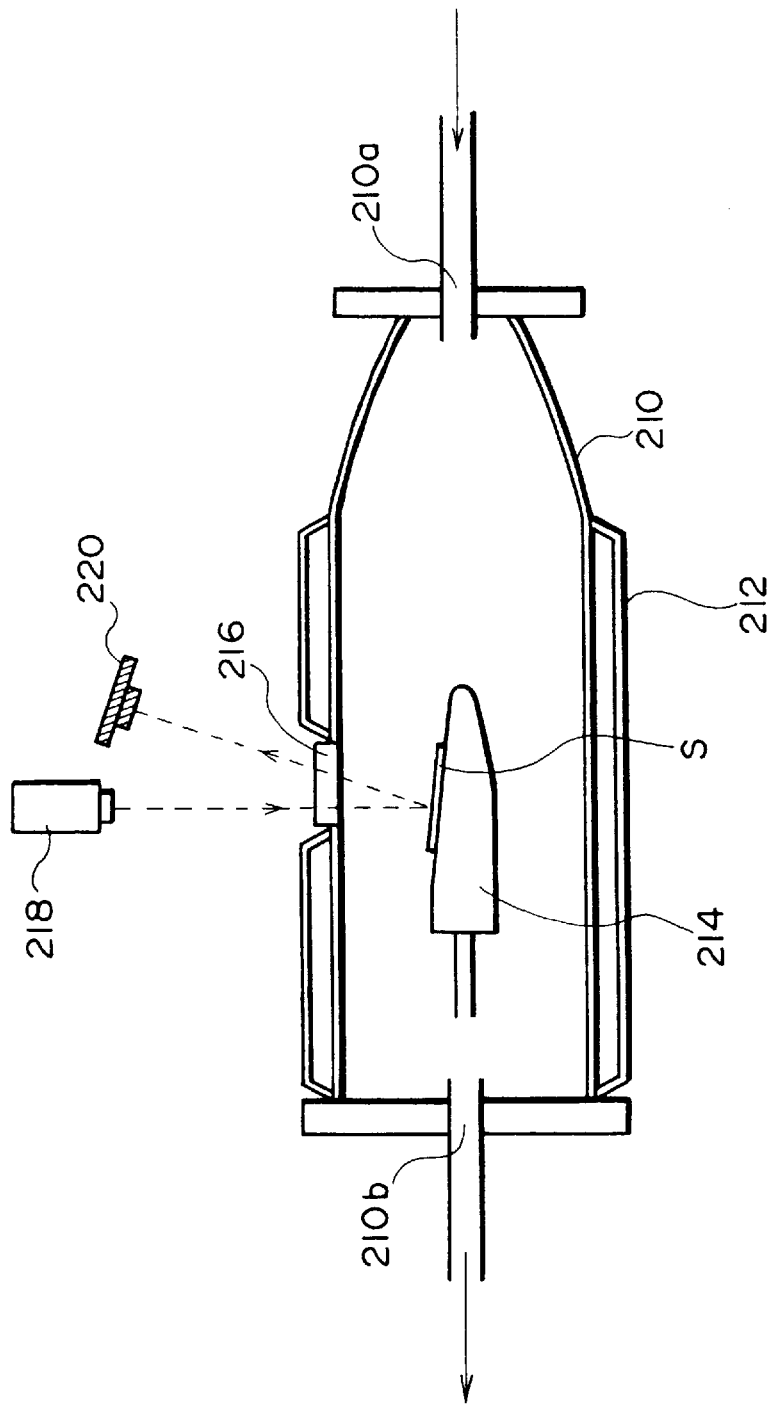
FIG. 7 is a schematic sectional view of an MOVPE device, as an example of a device for growing an epitaxial layer of the device shown in FIG. 1.

FIG. 7 shows an example device for growing an epitaxial layer in the implementation of the MOVPE method shown in FIG. 3A, capable of making continuous measurement of the reflectance of the epitaxial layer being grown. This layer growing device is a MOVPE device using a horizontal water-cooled reaction tube, characterized by having no water cooling tube above the growth substrate, and by having a non-reflective window allowing light to impinge on the top of the growth substrate from outside the reaction tube.

In other words, this MOVPE device has provided around a reaction tube 210 having a gas supply portion 210a to which is supplied the ingredient gas and a gas exhaust portion 210b, a cooling portion 212 which by means of water circulating therein cools the reaction tube. Within the reaction tube 210 is provided a susceptor 214 on which a substrate S is to be mounted, and in the wall of the reaction tube 210 facing the substrate mounting portion of this susceptor 214 is provided an observation window 216. Above the observation window 216 are positioned a light source 218 and an optical detector 220; light emitted from the light source 218 passes through the observation window 216 to reach the substrate S on the susceptor 214, and the reflected light passes once again through the observation window 216 to reach the optical detector 220.

Thus, by arranging that the light from the light source 218 impinges substantially perpendicularly (maximum 5°) on the substrate S, and measuring the reflected light by means of the optical detector 220, the device can measure changes in the reflectance of the epitaxial layer growing on the substrate S as the layer grows.

Figure 8:
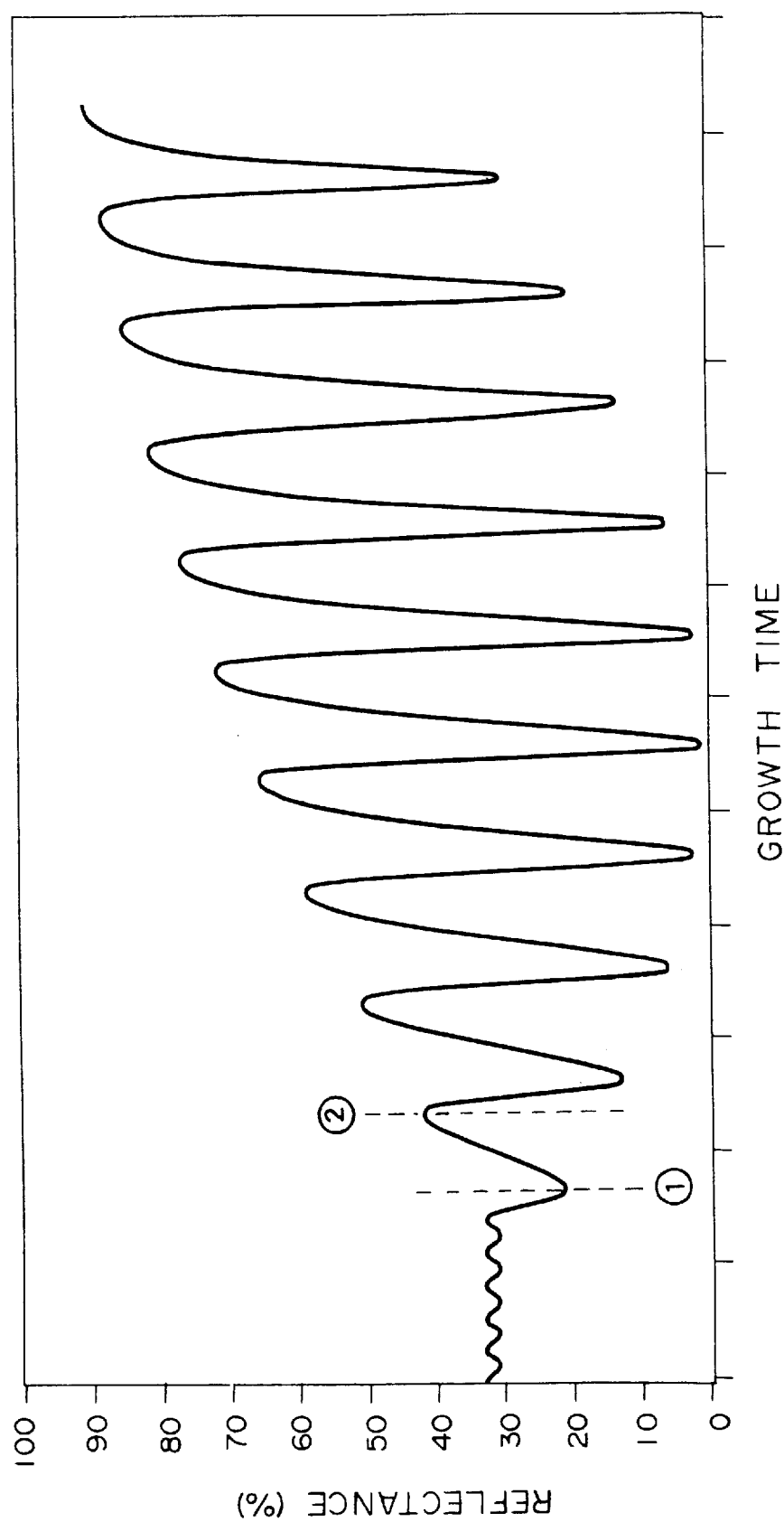
FIG. 8 is a characteristic graph showing the changes over time in the reflectance of layers in the stage of forming the second conducting layer and lower mirror, using the device of FIG. 7.

FIG. 8 shows the changes over time in the reflectance of the epitaxial layers in the stage of forming the second conducting semiconductor layer 101B and DBR mirror 103, which together form the surface emission type semiconductor laser of this embodiment, using the layer growth device shown in FIG. 7 for MOVPE growth. The horizontal axis indicates the growth time of the epitaxial layer, and the vertical axis shows the reflectance. Similarly, FIG. 9 shows the relationship between the layer thickness and reflectance in the process of growing the second conducting semiconductor layer 101B in FIG. 8.

Figure 9:
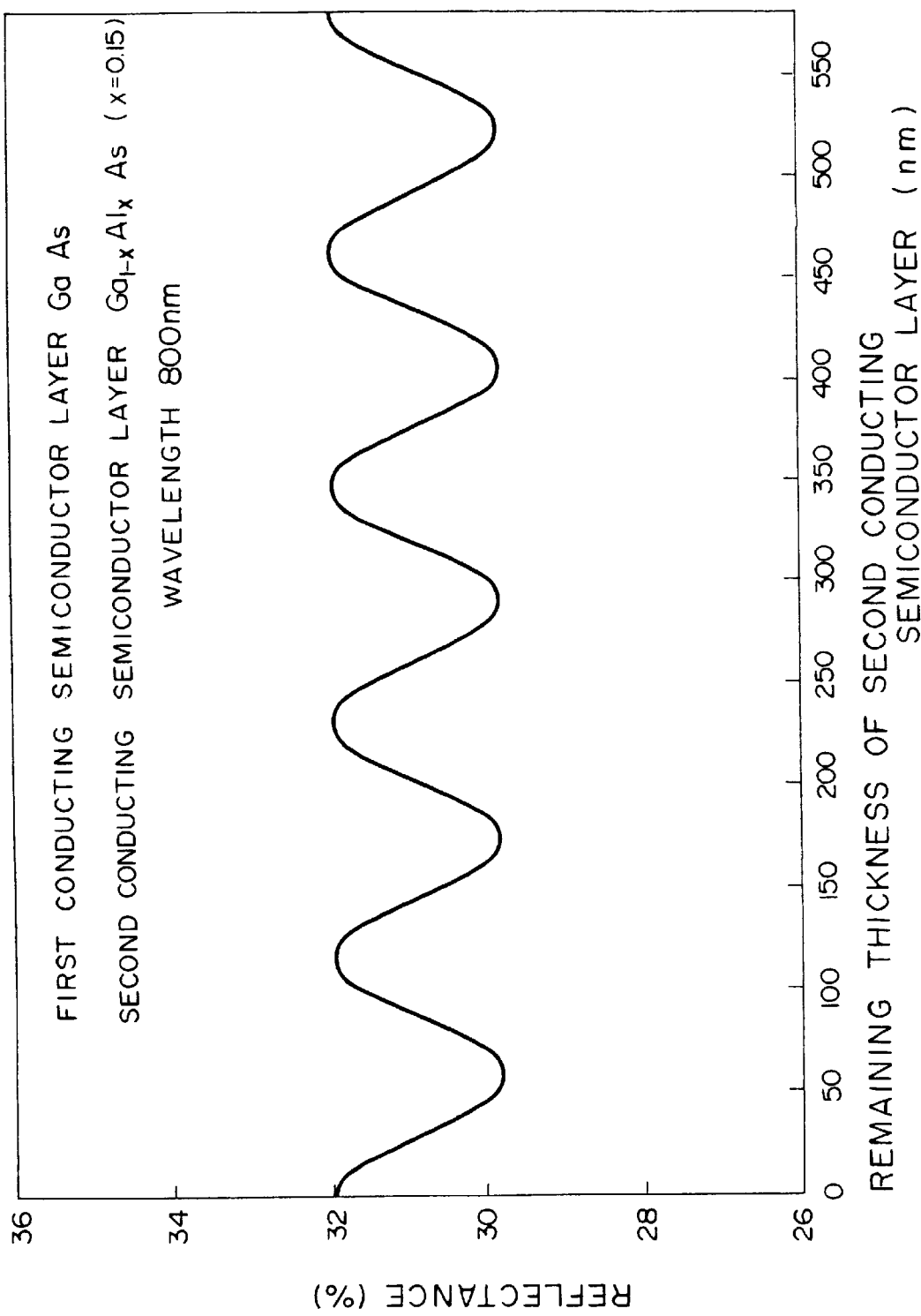
FIG. 9 is a characteristic graph showing the relationship between the thickness and reflectance of the second conducting layer in FIG. 8.

As shown in FIG. 9, as for the second conductive semiconductor layer 101B, if the wavelength being monitored is λ, and the refractive index of the second conducting semiconductor layer 101B is n, each time that a thickness of $\lambda/2n$ is deposited, the reflectance returns to the same value, varying cyclically to alternate between a maximum reflectance value (approximately 32%) and a minimum reflectance value (approximately 30%). This reflectance profile does not depend on the speed of crystal growth, nor on the time of crystal growth, but only on the thickness of the second conducting semiconductor layer 101B. As a result, by monitoring the reflectance profile, it is possible to precisely control the thickness of the second conducting semiconductor layer 101B.

It should be noted that when as described above the first and second conducting semiconductor layers 101A and 101B are formed of p-type and n-type GaAs respectively, the reflectance varies between a maximum value (approximately 32%) and a minimum value (approximately 31%), and it is thus clear that the difference between the minimum and maximum is reduced. It is therefore preferable, when using the above monitoring method, to vary the material and composition of the materials of the layer, to increase the difference in reflectance.

On the other hand, with respect to the formation of the lower mirror 103, as shown in FIG. 8, when initially a layer of $Al_{0.8}Ga_{0.2}As$ of a lower refractive index $n_1$ is grown on the second conducting semiconductor layer 101B, as the thickness increases the reflectance is reduced. When the thickness reaches ($\lambda/4n_1$), the trough point ① is reached, and when this trough point is monitored the growing material is switched to $Al_{0.15}Ga_{0.85}As$ with a higher refractive index of $n_2$. As the thickness of the $Al_{0.15}Ga_{0.85}As$ layer increases, the reflectance increases. But at a thickness of ($\lambda/4n_2$) a peak ② is reached, once again the growing material is switched to $Al_{0.8}Ga_{0.2}As$ of a lower refractive index $n_1$. By continuing this process, the reflectance of the DBR mirror increases, repeating alternates of lower and higher values.

This reflectance profile does not depend on the speed of crystal growth, nor on the time of crystal growth, but only on the thickness of the layers. As a result, at the turning points (points where the first derivative is zero) of this reflectance profile, the aluminum component is changed, and by epitaxial growth of alternate layers of different refractive indices, a DBR mirror 103 is obtained in which the layers have the thickness ($\lambda/4n$) according to theory.

Furthermore, since the reflectance of the DBR mirror 103 itself can be measured during crystal growth, it is possible to vary the number of layer-pairs in the DBR mirror 103 during growth, so as to optimize the construction.

Also, based on the growth speed of the layers measured from the turning points, it is also possible to control the thickness of the layers over the DBR mirror 103, so that compared with the conventional method of controlling the growth time, a method is obtained which has good repeatability and high throughput, for fabricating a crystalline growth substrate. In practice, with the growth method of this embodiment, a DBR mirror with the requisite reflectance of at least 99.5% required for a surface emission type laser element can be obtained in a controlled manner.

It should be noted that the above layer thickness control method can be applied for employ other layer forming processes in place of the MOVPE process, such as the MBE method.

Next, an embodiment is described which uses the means of monitoring the reflectance described above, when the RIBE process shown in FIGS. 4B and 4C is adopted.

Figure 10:
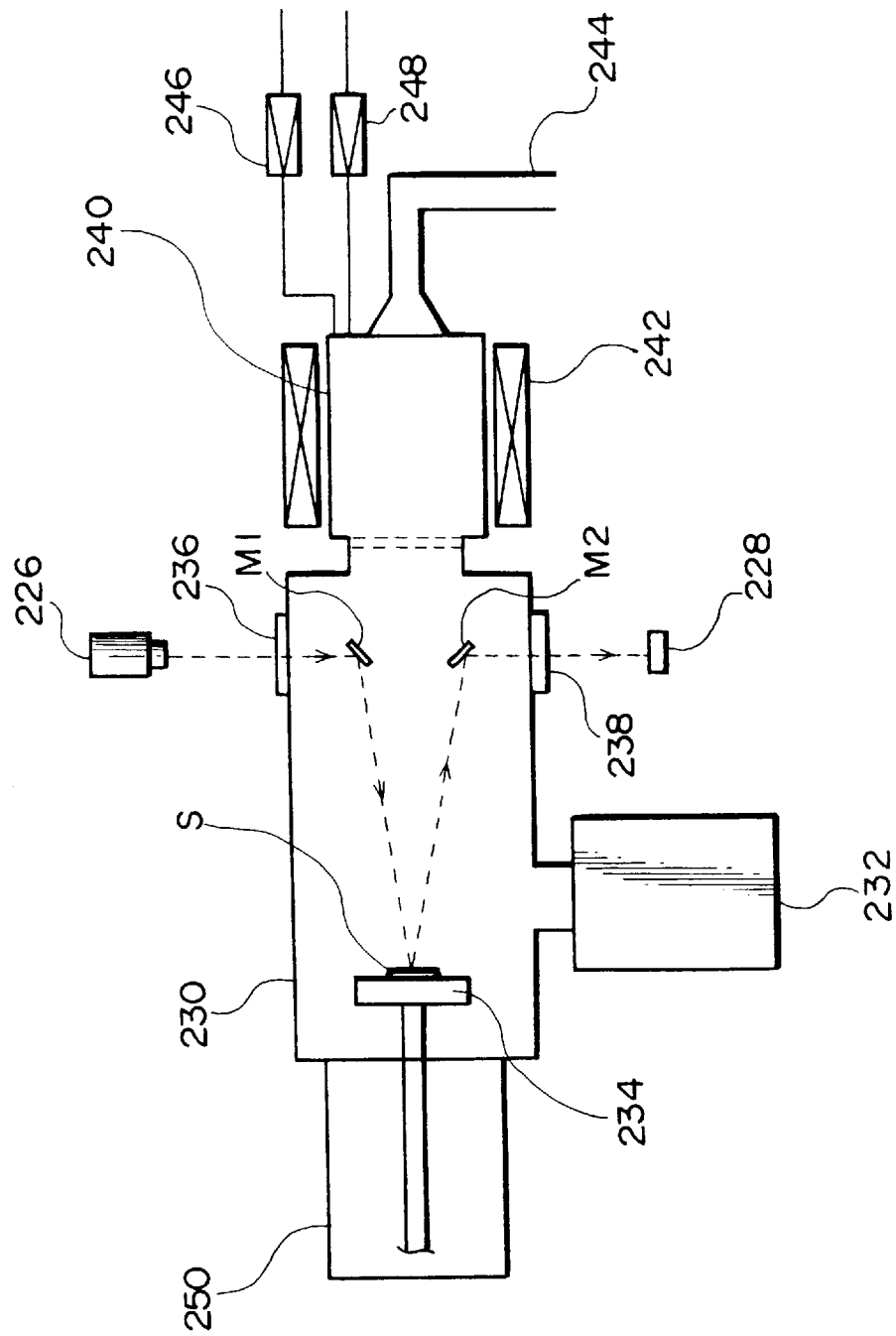
FIG. 10 is a schematic view of an RIBE device capable of measuring the reflectance of an epitaxial layer during etching.

In the etching carried out here, to obtain an accurate thickness for the $Ga_{0.85}Al_{0.15}As$ layer 101B2 which is the second conducting semiconductor layer of the optical detectors 100B, an etching device as shown in FIG. 10 is used.

FIG. 10 is an schematical view of an RIBE device capable of measuring the reflectance of an epitaxial layer during etching.

This RIBE device has an etching chamber 230 to which are connected a plasma chamber 240 and a vacuum pump 232 forming an exhausting means. The etching chamber 230 has a holder 234 in a position facing the plasma chamber 240, for supporting a substrate S. This holder 234 is provided so as to be able to be advanced or retracted through a load lock chamber 250. On the side wall of the etching chamber 230 by the plasma chamber 240 are provided monitoring windows 236 and 238, in opposing positions. Further within the etching chamber 230 are provided a pair of reflecting mirrors M1 and M2 on the line joining the monitoring windows 236 and 238. Externally to one monitoring window 236 a light source 226 is provided, and externally to the other monitoring window 238 an optical detector 228 is provided. The plasma chamber 240 is connected to a microwave introduction means 244, and to gas supply means 246 and 248 for supplying reagent gases to the plasma chamber 240. Additionally, around the plasma chamber 240 is provided a magnet 242.

In this RIBE device, as etching is carried out on a crystalline layer formed by normal methods on a substrate S, light from the light source 226 passes through the monitoring window 236 and is reflected by the reflecting mirror M1 to impinge on the substrate S, and the reflected light is reflected by the reflecting mirror M2 and passes through the monitoring window 238 to be measured by the optical detector 228, whereby the reflectance of the crystalline layer over the substrate S can be monitored.

Figure 11:
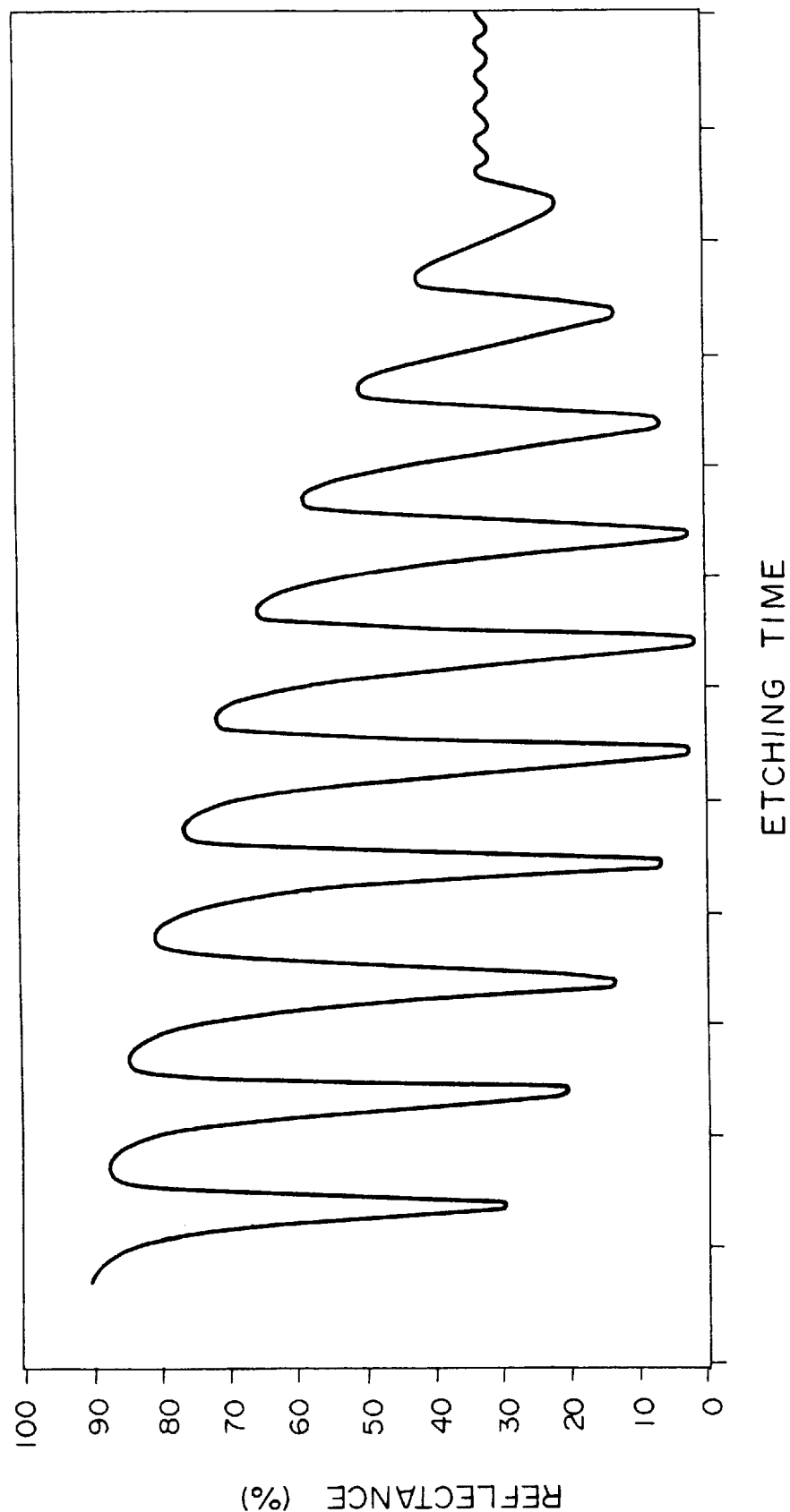
FIG. 11 is a characteristic graph showing the changes over time in the reflectance of layers in the stage of etching the lower mirror and second conducting layer, using the device of FIG. 10.

FIG. 11 is a graph showing the changes over time in the reflectance of layers in the stage of etching the n-type $Ga_{0.85}Al_{0.15}As$ layer 101B and DBR mirror 103, using the device shown in FIG. 10. The time axis in FIG. 11 is equivalent to the reverse of the elapsed time shown in FIG. 8 for the stage of epitaxial growth. As a result, by monitoring the reflectance profile, as shown in FIG. 4B, the etching end point can be controlled precisely when exposing the surface of the second conducting semiconductor layer 101B. Furthermore, in the subsequent etching of the second conducting semiconductor layer 101B to a specified thickness shown in FIG. 4C, the layer thickness can again be controlled precisely.

Moreover, in this embodiment, during epitaxial growth of the layers shown in FIG. 3A, since it is possible to monitor in advance the reflectance profile during growth, it is possible to control precisely the etching of the DBR mirror 103 and second conducting semiconductor layer 101B using this reflectance profile during growth. Also, this etching based on the reflectance profile can also be applied to the etching of layers over the DBR mirror 103.

Application to Position Detection Sensor

Figure 12:
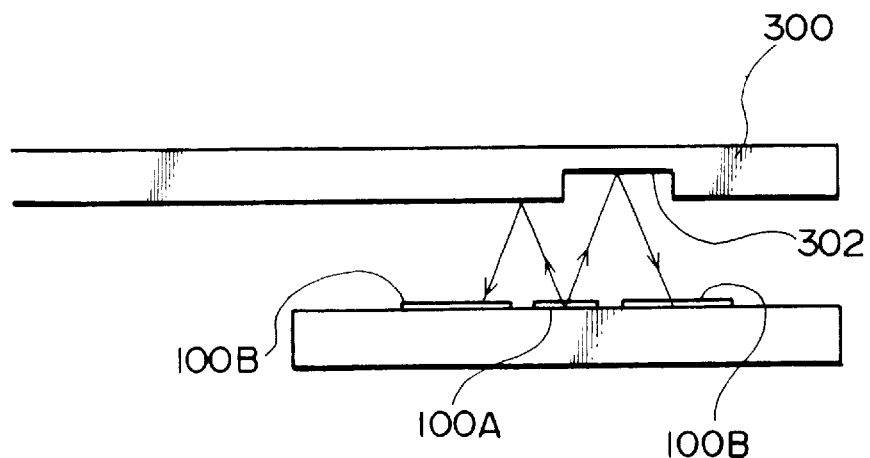
FIG. 12 is a schematic view showing the detection principle of a position detection sensor using the device of FIG. 1.

FIG. 12 shows an embodiment of the semiconductor laser device 100 with optical detectors of the above embodiment, applied to a position detection sensor. In this sensor, a target object 300 whose position is to be detected has for example a depression 302 formed therein. Laser beam emitted by the photoemitter 100A is reflected by the depression 302 and other regions, and the reflected beam is detected by for example two optical detectors 100B disposed around the periphery of the photoemitter 100A. The photoemitter 100A and optical detectors 100B are positioned accurately by precision patterning on the same substrate 102. As a result, by monitoring the ratio of the amounts of reflected light detected by the two optical detectors 100B, the position of the measurement target object 300 can be detected. If there is only one optical detector 100B, the position of the measurement target object 300 can be detected from the amount of reflected light detected by the single optical detector 100B.

Application to Pressure Sensor

Figure 13:
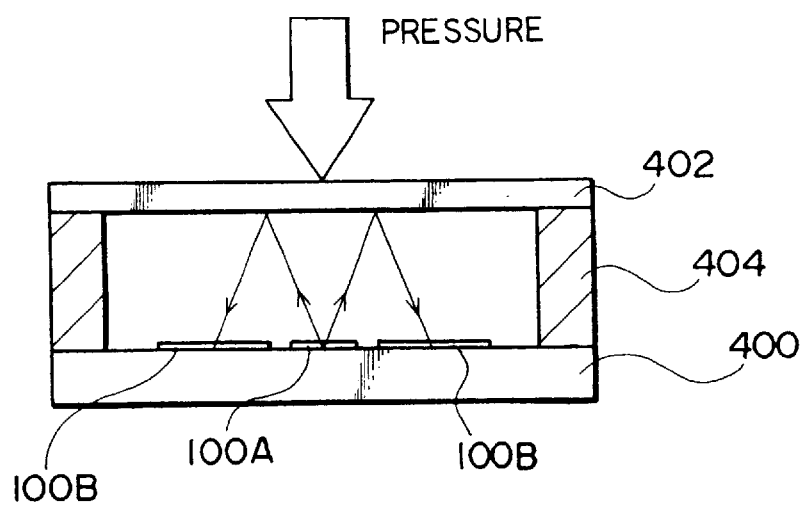
FIG. 13 is a schematic view showing the detection principle of a pressure sensor using the device of FIG. 1.

FIG. 13 shows an embodiment of the semiconductor laser device 100 with optical detectors of the above embodiment, applied to a pressure sensor. This laser device 100 is mounted on a base 400, and has a displacement member such as a metal film 402, which is displaced according to the applied pressure, supported on the base 400 by means of an elastically deformable material such as rubber 404. In this pressure sensor, in the same way as in the position detection sensor shown in FIG. 12, laser beam emitted by the for example central photoemitter 100A is reflected by the reverse surface of the metal film 402, and the reflected beam is detected by a plurality of optical detectors 100B. By monitoring the proportions of the amounts of reflected light detected by the optical detectors 100B, the magnitude of the pressure acting on the metal film 402 can be detected.

Using Optical Detectors for Monitoring

The optical detectors 100B can also be used to monitor the intensity of the laser beam emitted by the photoemitter 100A. Generally, this type of semiconductor laser is sealed with a cap. In this case, the beam emitting glass window formed on the cap can be processed so as to reflect back for example about 1% of the beam to the optical detectors 100B. Then the small amount of laser beam emitted by the photoemitter 100A and reflected by the glass window of the cap can be detected by the optical detectors 100B. In this case, if the intensity of the detected reflected beam falls, this can be interpreted to mean that the output of the laser has fallen, and an auto power control (APC) circuit can be used to supply a larger current to the semiconductor laser, thus automatically controlling the beam output.

The present invention is not limited to the embodiments described above, and various embodiments are possible within the scope of the present invention. The semiconductor laser with optical detectors can be applied not only to a position detector sensor and pressure sensor as described above, but also to a high-facsimile-speed-light-fiber-link, a high-speed optical coupler, an optical drive, optical-space-facsimile, an optical pickup, and so forth. Depending on the application, it may or may not be necessary to electrically isolate the photoemitter 100A and optical detectors 100B by the separating groove 116.

The method of the present invention also is not restricted to the steps and sequence shown in FIGS. 3A to 5B, and various variant embodiments are possible. For example, during the etching to form the pillar 114 in FIG. 3B, it is possible to etch simultaneously the epitaxial layer on the optical detector 100B side. Thereafter, the remainder of the epitaxial layer on the optical detector 100B side including the DBR mirror 103 and second conducting semiconductor layer 101B can be etched continuously to obtain the required thickness of the second conducting semiconductor layer 101B2. Furthermore, various rearrangements of the steps are possible, such as for example carrying out the step of forming the upper electrode 112 and dielectric multilayer mirror 111 in FIG. 5B before the step in FIG. 4A.

(Second Embodiment)

Figure 14:
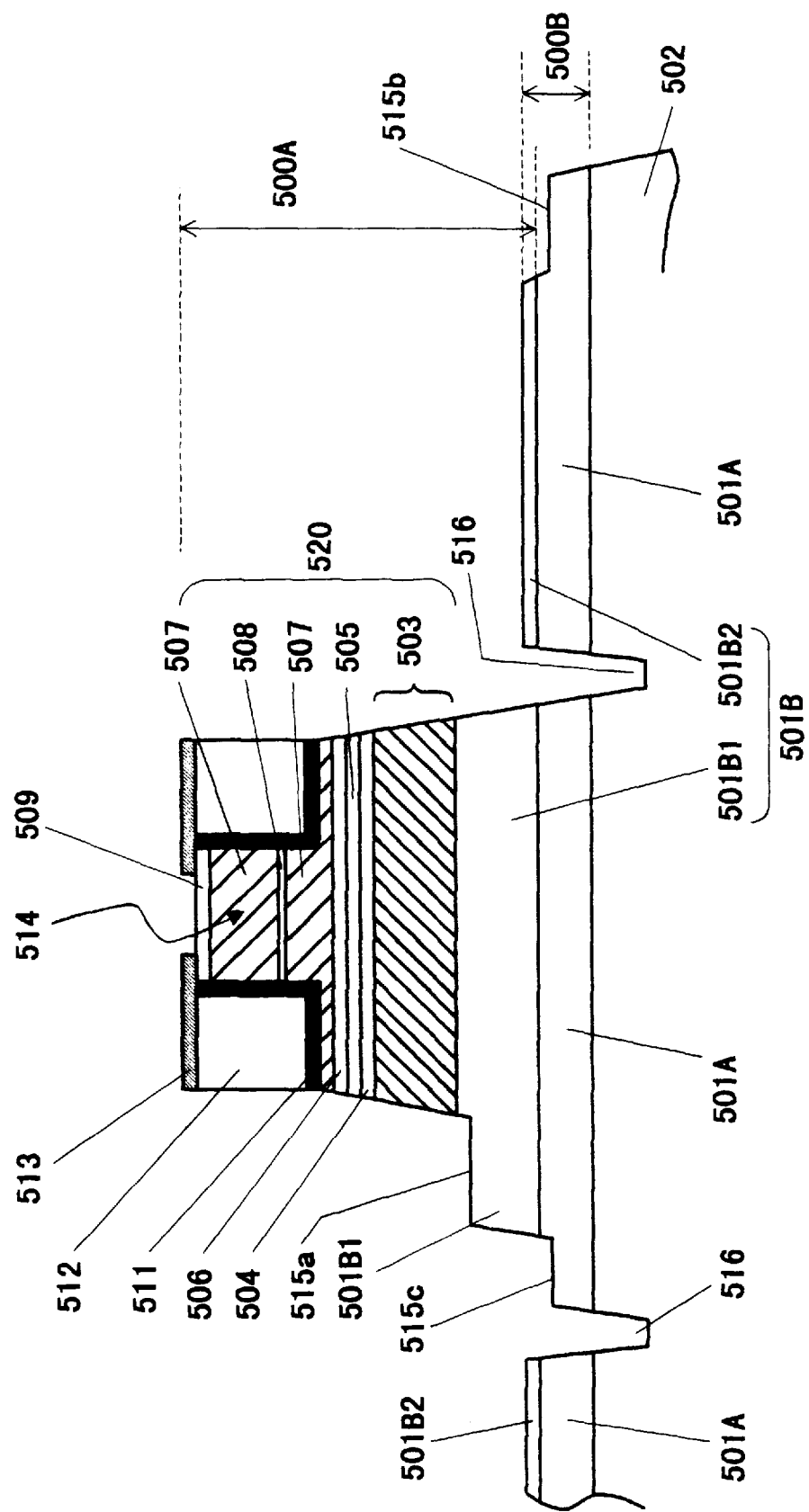
FIG. 14 is a schematic sectional view of the semiconductor laser provided with an optical detector of a second embodiment of the present invention.

FIG. 14 is a schematic sectional view of the photoemitter and optical detector of a second embodiment of the semiconductor laser provided with an optical detector of the present invention. The element in this embodiment is different from the element shown in FIG. 1, in the configuration of the surface emission type semiconductor laser which is the photoemitter, in that each of a pair of reflecting mirrors is formed as a semiconductor multilayer mirror, the semiconductor multilayer mirror on the light emitting side is formed as a pillar, and one of the layers forming the semiconductor multilayer mirror on the light emitting side is formed as a current constricting layer in a ring shape. Otherwise, the construction, including the optical detector is the same as in the previous embodiment.

The construction of the element and the method of fabrication are now described.

The semiconductor laser device 500 provided with an optical detector, shown in FIG. 14, includes a photoemitter 500A and an optical detector 500B on separate regions of a high-resistance semiconductor substrate 502. The photoemitter 500A is formed as a surface emission type semiconductor laser, and the optical detector 500B is formed as a photodiode.

The high-resistance semiconductor substrate 502 is formed as a GaAs substrate, and preferably with an impurity concentration of $1 \times 10^{16}$ cm$^{-3}$ or less, and more preferably of $1 \times 10^{15}$ cm$^{-3}$ or less.

On the high-resistance GaAs substrate 502, a p-type GaAs layer 501A and an n-type GaAs$_{0.85}$Al$_{0.15}$As layer 501B are formed sequentially by epitaxial growth. At this time the thickness of the n-type GaAs$_{0.85}$Al$_{0.15}$As layer 501B is at least 1 μm, and is preferably 5 μm or less. Furthermore, the carrier concentration in the n-type GaAs$_{0.85}$Al$_{0.15}$As layer 501B is preferably in the range from $5 \times 10^{17}$ cm$^{-3}$ to $2 \times 10^{19}$ cm$^{-3}$ and more preferably in the range from $1 \times 10^{18}$ cm$^{-3}$ to $1 \times 10^{19}$ cm$^{-3}$.

Thereafter, n-type AlAs layers and n-type GaAs$_{0.85}$Al$_{0.15}$As layers are formed in alternation, and a 25-pair DBR mirror 503 with a reflectance of at least 99% with respect to light of a wavelength of about 800 nm is formed as a lower mirror. Then after an n-type GaAs$_{0.53}$Al$_{0.47}$As layer (first cladding layer) 504 has been formed, a quantum well (MQW) active layer 505 is formed by alternately forming n⁻-type GaAs well layers and n⁻-type Ga$_{0.7}$Al$_{0.3}$As barrier layers. Thereafter a p-type GaAs$_{0.53}$Al$_{0.47}$As layer (second cladding layer) 506 is formed. Here the total thickness of the first cladding layer 504, active layer 505, and second cladding layer 506 is approximately one wavelength of the laser wavelength within the first cladding layer, active layer, and second cladding layer. By making the total thickness of the first cladding layer, active layer, and second cladding layer which form the length of laser resonator approximately one wavelength, the number of times which the light oscillates within the resonator is increased, and therefore the conversion efficiency of the current supplying into the active layer is increased, and the element characteristics are improved.

Further, on the second cladding layer 506, p-type GaAs$_{0.18}$Al$_{0.82}$As layers and p-type GaAs$_{0.85}$Al$_{0.15}$As layers are formed in alternation, and a 30-pair DBR mirror 507 with a reflectance of at least 99% with respect to light of a wavelength of about 800 nm is formed as an upper mirror.

Here, during epitaxial growth of the p-type GaAs$_{0.18}$Al$_{0.82}$As layer in the tenth pair from the second cladding layer 506, the amounts of raw materials supplied are varied to form a p-type AlAs layer 508. In oxidation processing described below, this p-type AlAs layer 508 forms a current constricting layer. The current constricting layer is positioned at the tenth pair from the second cladding layer in this embodiment, but a preferred range for the layer is formed between 0.2 μm and 1.5 μm from the active layer to the emission side. If the current constricting layer is formed below 0.2 μm, since the current constricting layer which is of different material characteristics from a semiconductor, is close to the active layer which is the photoemitter, the active layer tends to be influenced such as distortion, and this leads to the element characteristics being impaired. During the etching of the pillar portion, the current constricting layer requires the side surface of the AlAs layer to be exposed, while the surface of the second cladding layer must not be exposed. Thus the range for the end of etching is restricted, and it is difficult to stop etching in the restricted range. On the other hand, when the current constricting layer is formed above 1.5 μm, the current spreads out below the current constricting layer, and the current is not effectively supplied into the central portion of the active layer, and again the element characteristics are not improved.

Again, by making the change in the supply of raw material gradual between the p-type GaAs$_{0.18}$Al$_{0.82}$As layers and p-type GaAs$_{0.85}$Al$_{0.15}$As layers forming the upper mirror 507, rapid transitions between the layers are avoided. With this construction, a current is passed through the upper mirror 507 and supplied into the active layer. As a result, the current flows intersecting the interfaces between the layers forming the upper mirror 507. Since the composition of the p-type GaAs$_{0.18}$Al$_{0.82}$As layers and p-type GaAs$_{0.85}$Al$_{0.15}$As layers are different, the energy band gaps are different. Thus energy differences occurs at the interfaces, which generates a large resistance component with respect to the current. Here, in this embodiment, by changing the composition at the interfaces gradually to the extent compatible with no significant reduction in the reflectivity, energy differences can be avoided. The reason this construction is applied only to the upper mirror is that in processing described below the upper mirror is etched to a pillar of diameter a few micrometers, therefore the area through which the current flows becomes small and the resistance is increased. The area of the lower mirror through which the current flows is large compared with the upper mirror, therefore the interface resistance has no influence. Thus, in the lower mirror the interface transitions are rapid, which prevents the reflectivity from being reduced.

Finally, a p-type GaAs layer (contact layer) 509 is formed on the upper mirror 507.

The above described layers are expitaxially formed by metal-organic vapor phase epitaxy (MOVPE). In particular, the change between layers is carried out by switching the valves in the raw material supply lines for the rapid changes of the interface composition, and by using a mass flow controller (MFC) to change the material supply amounts when the interface composition is gradually changed. Other growth conditions are the same as in the first embodiment.

After the formation of the layers, using thermal CVD at normal pressure, a protective layer of SiO$_2$ of thickness approximately 250 angstroms is formed.

Next, using an electron cyclotron resonance-reactive ion beam etching system to carry out reactive ion beam etching (RIBE), the upper mirror 507 is etched to leave a pillar portion 514 and optical detector 500B which are covered by a resist pattern. The amount of etching is sufficient at least to expose the side surface of the p-type AlAs layer 508 within the upper mirror 507 but not to the extent to expose the surface of the second cladding layer 506. Since in this embodiment the overall thickness of the upper mirror layer is 3 μm, etching was carried out to a depth of 2.7 μm. Since the etching uses the RIBE method, the side walls of the pillar portion are substantially vertical, and there is almost no damage to the epitaxial layers. The RIBE conditions are the same as in the first embodiment. With these RIBE conditions, the ratio between the etching amounts of the resist as a mask and the epitaxial layers (the selectivity) is between 1.5 and 2, therefore a resist thickness of 2 μm may be used for an etching depth of 2.7 μm.

The maximum thickness of a resist with a pattern resolution of a few μm is generally about 5 μm. Therefore under the above etching conditions the maximum etching depth is 10 μm.

After etching the pillar portion, the resist pattern is removed, and the surface is washed. Thereafter, while heating the substrate to 400° C., nitrogen including steam is applied to the etched surface. The steam reacts with the p-type AlAs layer 508 exposed at the side of the pillar portion, and the AlAs is oxidized to form aluminum oxide. Since this reaction progresses with time from the surroundings of the pillar portion to the interior, by controlling the time, it is possible to form an aluminum oxide layer in a ring around the periphery of the p-type AlAs layer 508 in the pillar portion. Since aluminum oxide is insulating, a current constricting layer can be formed in a ring within the pillar portion. The speed of oxidation of the AlAs depends on the temperature of the substrate and the applying rate of the nitrogen including saturated steam, and under the conditions of 400° C. and 1 liter/minute, was 2 μm/minute. After the desired oxidation has been carried out the application of nitrogen stops.

Thereafter, using thermal CVD at normal pressure, an SiO$_2$ layer 511 of approximately 1000 angstroms is formed on the surface. Further thereon, an SOG layer 512 is applied using the spin coating method, then baking is carried out in nitrogen to form an insulating layer. Here the SiO$_2$ layer 511 is essential as an insulating layer, but the SOG layer 512 may be omitted.

Next the SOG layer 512 and SiO$_2$ layer 511 formed on the surface of the pillar portion are etched back, and made so that the surface is flush with the surface of the exposed contact layer 509. For the etching, reactive ion etching method is used with parallel plate electrodes.

Next, around the periphery of the photoemitter 500A, etching is carried out to expose the surface of the n-type GaAs$_{0.85}$Al$_{0.15}$As layer 501B. For the region which forms the optical detector 500B, the n-type GaAs$_{0.85}$Al$_{0.15}$As layer 501B is etched to an optimum thickness for optical detection by the optical detector 500B. Both of these etching methods may be the same as in the first embodiment. In this embodiment, for example the overall thickness of the upper mirror is 3 μm, the total thickness of the first cladding layer, active layer, and second cladding layer is 0.2 to 0.3 μm, the overall thickness of the lower mirror is 2.7 μm, and the thickness of the n-type GaAs$_{0.85}$Al$_{0.15}$As layer 501B is 1 to 5 μm. To obtain the optimum thickness for the n-type GaAs$_{0.85}$Al$_{0.15}$As layer 501B, a maximum etching depth of approximately 11 μm is required. Since in the first embodiment there is no need for etching of the upper mirror, in this step the etching depth was not more than 10 μm.

As described above, since etching using the RIBE method yields a low selectivity ratio with the resist masking, the maximum etching depth is 10 μm, therefore the method cannot be used for the current step in which an etching depth of about 11 μm is required. In the etching of this step, therefore dry etching method using an inductively coupled plasma etching system (ICP etching method) is applied. This etching system uses a mixture of chlorine gas and argon gas.

The etching conditions for this embodiment, with chlorine gas 30 CCM, argon gas 12 CCM, etching pressure 5 mTorr, and applied power 300 W, gave a selectivity with respect to the resist masking of 5. With approximately 3 μm of resist masking, an etching depth of 11 μm was achieved.

Therefore in this embodiment, sing the above etching method the n-type $GaAs_{0.85}Al_{0.15}As$ layer 501B is etched so that the thickness remaining after etching is the desired thickness.

However, since the ICP etching method is an etching method which does not use an ion beam, it is not possible by etching to obtain a construction with vertical side surfaces. Here different etching methods are used depending on the portion to be etched such that the RIBE etching method is used for the pillar resonator portion and the ICP etching method is used for the photodiode surface.

Next, etching is used to form stepped surface in each of the p-type GaAs layer 501A and an n-type $GaAs_{0.85}Al_{0.15}As$ layer 501B, exposing the corresponding layers and forming electrode pattern forming surfaces 515a, 515b, and 515c.

Furthermore, separating grooves are formed so that the first conducting semiconductor layers 501A of the photoemitter 500A and the optical detector 500B are electrically insulated each other and the second conducting semiconductor layers 501B1 and 501B2 of the photoemitter 500A and optical detector 500B are electrically insulated each other.

The methods used are the same as in the first embodiment, but when dry etching is used, the ICP etching method described above is used for a large amount etching.

Finally, an upper electrode 513 making ring-shaped contact with the contact layer 509 is formed by the lift-off method, and the respective electrodes is also formed on each of the electrode pattern forming surface.

By means of the above steps, the surface emission type semiconductor laser provided with an optical detector is completed.

It should be noted that the surface emission type semiconductor laser provided with an optical detector of this embodiment may be used in the same way as the first embodiment, and further that various sensors may be made as applications thereof in the same way as for the first embodiment.

What is claimed is:

1. A surface emission type semiconductor laser having an optical detector, comprising:
    a semiconductor substrate having first and second regions formed therein;
    a first conducting semiconductor layer formed on each of said first and second regions;
    a second conducting semiconductor layer formed on each of said first and second regions of said first conducting semiconductor layer; and
    an optical resonator formed on said second conducting semiconductor layer on said first region, and said optical resonator emitting light in a direction perpendicular to said semiconductor substrate;
    wherein said second conducting semiconductor layer on said first region has a thickness of at least 1 μm, and is used as a lower electrode for supplying a current to said optical resonator; and
    said first and second conducting semiconductor layers form at least one photodiode on said second region, and said second conducting semiconductor layer forming said at least one photodiode has a thickness of less than 1 μm.

2. The surface emission type semiconductor laser according to claim 1, wherein said second conducting semiconductor layer on said first region has a thickness of less than or equal to 5 μm.

3. The surface emission type semiconductor laser according to claim 2, wherein said second conducting semiconductor layer on each of said first and second regions has the carrier concentration from $5 \times 10^{17}$ to $2 \times 10^{19}$ $cm^{-3}$.

4. The surface emission type semiconductor laser according to claim 1, wherein said second conducting semiconductor layer on said first region has a thickness ranging from 2 μm to 3 μm.

5. The surface emission type semiconductor laser according to claim 4, wherein said second conducting semiconductor layer on each of said first and second regions has the carrier concentration from $1 \times 10^{18}$ to $1 \times 10^{19}$ $cm^{-3}$.

6. The surface emission type semiconductor laser according to claim 1, wherein said second conducting semiconductor layer on said second region has a thickness of less than or equal to 0.8 μm.

7. The surface emission type semiconductor laser according to claim 1, wherein said second conducting semiconductor layer on said second region has a thickness of less than or equal to 0.5 μm.

8. The surface emission type semiconductor laser according to claim 1, wherein said optical resonator comprises:
    a pair of reflecting mirrors, and
    a multilayer semiconductor layer including at least an active layer and a cladding layer, said multilayer semiconductor layer being formed between said pair of reflecting mirrors; and
    wherein an upper layer of said multilayer semiconductor layer including at least said cladding layer forms a pillar portion; an insulating layer is embedded in the periphery of said pillar portion; an upper electrode is provided having an opening formed therein at the end surface of said pillar portion; and one of said pair of mirrors being on the light emitting side is formed to cover said opening.

9. The surface emission type semiconductor laser according to claim 8, wherein one of said pair of reflecting mirrors formed on said second conducting semiconductor layer is a semiconductor multilayer mirror, and another of said pair of reflecting mirrors on the light emitting side is a dielectric multilayer mirror; and
    wherein said multilayer semiconductor layer formed between said pair of reflecting mirrors includes:
    a first cladding layer formed on said semiconductor multilayer mirror;
    an active layer of quantum well structure formed on said first cladding layer;
    a second cladding layer formed on said active layer; and
    a contact layer formed on said second cladding layer; and wherein said second cladding layer and said contact layer form said pillar portion.

10. The surface emission type semiconductor laser according to claim 1, wherein said first conducting semiconductor layer on said first region and said first conducting semiconductor layer on said second region are electrically insulated; and
    said second conducting semiconductor layer on said first region and said second conducting semiconductor layer on said second region are electrically insulated.

11. A sensor having the surface emission type semiconductor laser having an optical detector according to claim 10, wherein said optical resonator irradiates a relocatable measurement target object with laser beam, and laser beam reflected on said measurement target object impinges on said at least one photodiode, so as to detect the position of said measurement target object.

12. The sensor according to claim 11:

wherein a plurality of said photodiodes are irradiated with said reflected laser beam emitted by said optical resonator so as to detect said position of said measurement target object based on the distribution of light amounts detected by each of said plurality of photodiodes.

13. A sensor having the surface emission type semiconductor laser having an optical detector according to claim 10, wherein said optical resonator irradiates an element whose position changes according to an applied pressure with laser beam, laser beam reflected on said measurement target object impinges on said at least one photodiode, so as to detect the magnitude of the pressure applied to said element.

14. The sensor according to claim 13, wherein a plurality of said photodiodes are irradiated with said reflected laser beam emitted by said optical resonator so as to detect said magnitude of the pressure applied to said element.

15. The surface emission type semiconductor laser according to claim 1, wherein said optical resonator comprises:

a pair of reflecting mirrors; and a multilayer semiconductor layer including at least an active layer and a cladding layer, said multilayer semiconductor layer being formed between said pair of reflecting mirrors; and wherein said pair of reflecting mirrors are semiconductor multilayer mirrors; one of said pair of semiconductor multilayer mirrors being on the light emitting side forms a pillar portion, and an upper electrode is provided having an opening formed therein at the end surface of said pillar portion.

16. The surface emission type semiconductor laser according to claim 15, wherein at least one of said multilayer semiconductor layer forming said semiconductor multilayer mirror on said light emitting side is a ring-shaped current constricting layer.

17. The surface emission type semiconductor laser according to claim 16, wherein said current constricting layer is formed within said multilayer semiconductor layer comprising said semiconductor multilayer mirror on the light emitting side in the range from 0.2 $\mu$m to 1.5 $\mu$m from said active layer.

18. The surface emission type semiconductor laser according to claim 17, wherein said current constricting layer is formed within said pillar portion.

19. A method of manufacturing a surface emission type semiconductor laser having an optical detector wherein a surface emission type semiconductor laser is formed on a first region of a semiconductor substrate, and at least one photodiode is formed on a second region of said semiconductor substrate, comprising the steps of:

(a) successively epitaxially growing on each of said first and second regions a first conducting semiconductor layer, a second conducting semiconductor layer having a thickness of at least 1 $\mu$m, and an optical resonator formed from a pair of reflecting mirrors and a multilayer semiconductor layer formed therebetween excluding the reflecting mirror on the emission side;

(b) etching an upper layer of said multilayer semiconductor layer including at least a cladding layer to form a pillar portion on said first region of said epitaxial growth layers;

(c) embedding an insulating layer in the periphery of said pillar portion;

(d) forming an upper electrode having an opening formed therein at the end surface of said pillar portion;

(e) forming the mirror on the light emitting side to cover said opening; and (f) etching said epitaxial growth layer in said second region, said etching step is terminated leaving a part of said second conducting semiconductor layer so that said second conducting semiconductor layer on said second region has a thickness of less than 1 $\mu$m.

20. The method according to claim 19, wherein in said step (a) said second conducting semiconductor layer has the carrier concentration ranging from $5 \times 10^{17}$ to $2 \times 10^{19}$ cm$^{-3}$ and a thickness of less than or equal to 5 $\mu$m.

21. The method according to claim 19, wherein in said step (a) said second conducting semiconductor layer has the carrier concentration ranging from $1 \times 10^{18}$ to $1 \times 10^{19}$ cm$^{-3}$ and a thickness of between 2 $\mu$m and 3 $\mu$m.

22. The method according to claim 19, wherein in step (f) said second conducting semiconductor layer on said second region has a thickness of less than or equal to 0.8 $\mu$m.

23. The method according to claim 19, wherein in step (f) said second conducting semiconductor layer on said second region has a thickness of less than or equal to 0.5 $\mu$m.

24. The method according to claim 19, wherein in step (a) during the epitaxial growth of at least said second conducting semiconductor layer and said mirror thereon, light of a predetermined wavelength is irradiated at said second conducting semiconductor layer and said mirror thereon, the reflected spectrum is detected, and the reflectance profile is measured to control the thickness of said second conducting semiconductor layer and said mirror thereon.

25. The method according to claim 19, wherein in step (f) during the etching of at least said second conducting semiconductor layer and said mirror thereon, light of a predetermined wavelength is irradiated at said second conducting semiconductor layer and said mirror thereon, the reflected spectrum is detected, and the reflectance profile is measured to control the etching amount of said second conducting semiconductor layer and said mirror thereon.

26. The method according to claim 19, further comprising:

a step of electrically insulating said first conducting semiconductor layer on said first region from said first conducting semiconductor layer on said second region, and said second conducting semiconductor layer on said first region from said second conducting semiconductor layer on said second region.

27. A method of manufacturing a surface emission type semiconductor laser having an optical detector wherein a surface emission type semiconductor laser is formed on a first region of a semiconductor substrate, and at least one photodiode is formed on a second region of said semiconductor substrate, comprising the steps of:

(a) successively epitaxially growing on each of said first and second regions a first conducting semiconductor layer, a second conducting semiconductor layer having a thickness of at least 1 $\mu$m, a semiconductor multilayer mirror, a first cladding layer, an active layer of quantum well structure, a second cladding layer, and a contact layer;

(b) etching said epitaxial growth layers in said first region, said etching step is terminated leaving a part of said second cladding layer to form a pillar portion formed by said second cladding layer and said contact layer;

(c) embedding an insulating layer in the periphery of said pillar portion;

(d) forming an upper electrode having an opening formed therein at the end surface of said pillar portion;

(e) forming a dielectric multilayer mirror to cover said opening; and (f) etching said epitaxial growth layer in said second region, said etching step is terminated leaving a part of said second conducting semiconductor layer so that said second conducting semiconductor layer on said second region has a thickness of less than 1 μm.

28. A method of manufacturing a surface emission type semiconductor laser having an optical detector, wherein a surface emission type semiconductor laser is formed on a first region of a semiconductor substrate, and at least one photodiode is formed on a second region of said semiconductor substrate, comprising the steps of:

(a) successively epitaxially growing on each of said first and second regions a first conducting semiconductor layer, a second conducting semiconductor layer having a thickness of at least 1 μm, a pair of reflecting mirrors and a multilayer semiconductor layer formed therebetween;

(b) etching one of said pair of reflecting mirrors being on the light emitting side to form a pillar portion on said first region of said epitaxial growth layers;

(c) forming an insulating layer in the periphery of said pillar portion;

(d) forming an upper electrode having an opening formed therein at the end surface of said pillar portion; and (e) etching said epitaxial growth layer in said second region, said etching step is terminated leaving a part of said second conducting semiconductor layer so that said second conducting semiconductor layer on said second region has a thickness of less than 1 μm.

29. The method according to claim 28, wherein:

in said step (b) said one of said pair of reflecting mirrors being on the light emitting side is etched by using an electron cyclotron resonance-reactive ion beam etching system which uses a gas being a mixture of chlorine gas and argon gas; and in said step (e) said epitaxial growth layer in said second region is etched by using an inductively coupled plasma etching system which uses a gas being a mixture of chlorine gas and argon gas.

* * * * *